US012763055B2

(12) United States Patent
Chen et al.

(10) Patent No.: US 12,763,055 B2
(45) Date of Patent: Oct. 13, 2026

(54) MUFFLER FOR COOLING FAN NOISE REDUCTION

(71) Applicant: Laird Technologies (Shenzhen) Ltd., Shenzhen (CN)

(72) Inventors: Shangyu Chen, Shenzhen (CN); Xu Han, Shenzhen (CN); Qingsheng Gao, Shenzhen (CN); Yifan Xu, Shenzhen (CN); Xiaohu Xu, Shenzhen (CN); Donglai Xu, Shenzhen (CN); Guiyun Chen, Shenzhen (CN); Youhong Li, Shenzhen (CN)

(73) Assignee: Laird Technologies (Shenzhen) Ltd., Shenzhen (CN)

( * ) Notice: Subject to any disclaimer, the term of this patent is extended or adjusted under 35 U.S.C. 154(b) by 156 days.

(21) Appl. No.: 18/924,998

(22) Filed: Oct. 23, 2024

(65) Prior Publication Data

US 2025/0131903 A1 Apr. 24, 2025

(30) Foreign Application Priority Data

Oct. 26, 2023 (CN) ......................... 202322887657.1

(51) Int. Cl.
*G10K 11/00* (2006.01)
*H05K 7/20* (2006.01)

(52) U.S. Cl.
CPC ....... *G10K 11/002* (2013.01); *H05K 7/20727* (2013.01)

(58) Field of Classification Search
CPC .... F04D 29/663; F04D 29/664; F04D 29/665; G01K 11/002; H05K 7/20718; H05K 7/20727; H05K 7/20736; G10K 11/002
See application file for complete search history.

(56) References Cited

U.S. PATENT DOCUMENTS

| | | | | |
|---|---|---|---|---|
| 2,088,576 | A * | 8/1937 | Compo | F01N 1/089 181/275 |
| 3,033,307 | A * | 5/1962 | Sanders | B64F 1/26 181/224 |
| 5,930,371 | A * | 7/1999 | Cheng | G10K 11/161 381/71.7 |
| 6,896,095 | B2 * | 5/2005 | Shah | F01P 5/06 181/198 |
| 7,779,960 | B2 * | 8/2010 | Tang | H05K 7/20172 181/224 |

(Continued)

*Primary Examiner* — Nathaniel E Wiehe
*Assistant Examiner* — Jason G Davis
(74) *Attorney, Agent, or Firm* — Harness, Dickey & Pierce, P.L.C.; Anthony G. Fussner

(57) ABSTRACT

A silencer or muffler for reducing noise of a heat dissipation or cooling fan includes an outer tube and at least one inner tube inside the outer tube. An annular space is formed between the inner and outer tubes. An inner cavity of the inner tube forms a ventilation channel. Partition plates are installed in the annular space that partition the annular space into silencing chambers arranged along a conveying direction of airflow. The inner tube includes openings communicating the silencing chambers with the ventilation channel. The silencing chambers are disposed correspondingly to silencing frequency bands. A limited installation space in an electronic device chassis can be used to achieve sound absorption and noise reduction for a heat dissipation fan in the silencing frequency bands.

19 Claims, 16 Drawing Sheets

(56) References Cited

U.S. PATENT DOCUMENTS

| | | | | |
|---|---|---|---|---|
| 7,891,464 | B2 * | 2/2011 | Tang | F04D 29/663<br>181/224 |
| 11,905,916 | B1 * | 2/2024 | Cao | F02M 35/1261 |

* cited by examiner

MUFFLER FOR COOLING FAN NOISE REDUCTION

CROSS-REFERENCE TO RELATED APPLICATION

The present application claims priority to and the benefit of Chinese Utility Model Application No. 202322887657.1 filed Oct. 26, 2023, which registered as Chinese Present disclosure ZL 202322887657.1 on May 31, 2024. The entire disclosure of Chinese Utility Model Application No. 202322887657.1 is incorporated herein by reference.

FIELD

The present disclosure relates to silencers or mufflers operable for reducing noise of heat dissipation/cooling fans in electronic devices.

BACKGROUND

This section provides background information related to the present disclosure which is not necessarily prior art.

A heat dissipation fan may be used to achieve heat dissipation of an electronic device. It has been found in the prior art that noise of the heat dissipation fan is a main factor that affects the read/write performance of a hard disk. And the greater the noise of the fan, the worse the read/write performance of the hard disk. But the market is driving the capacity of hard disks to become greater and greater. The layout of electronic devices such as servers, memories, and computers is becoming more compact, and components are becoming lighter and thinner. All of these factors will cause the read/write performance of the hard disk to be more sensitive to vibration and noise.

DRAWINGS

The drawings described herein are for illustrative purposes only of selected embodiments and not all possible implementations, and are not intended to limit the scope of the present disclosure.

Corresponding reference numerals may indicate corresponding (though not necessarily identical) features throughout the several views of the drawings.

DETAILED DESCRIPTION

Figure 1:
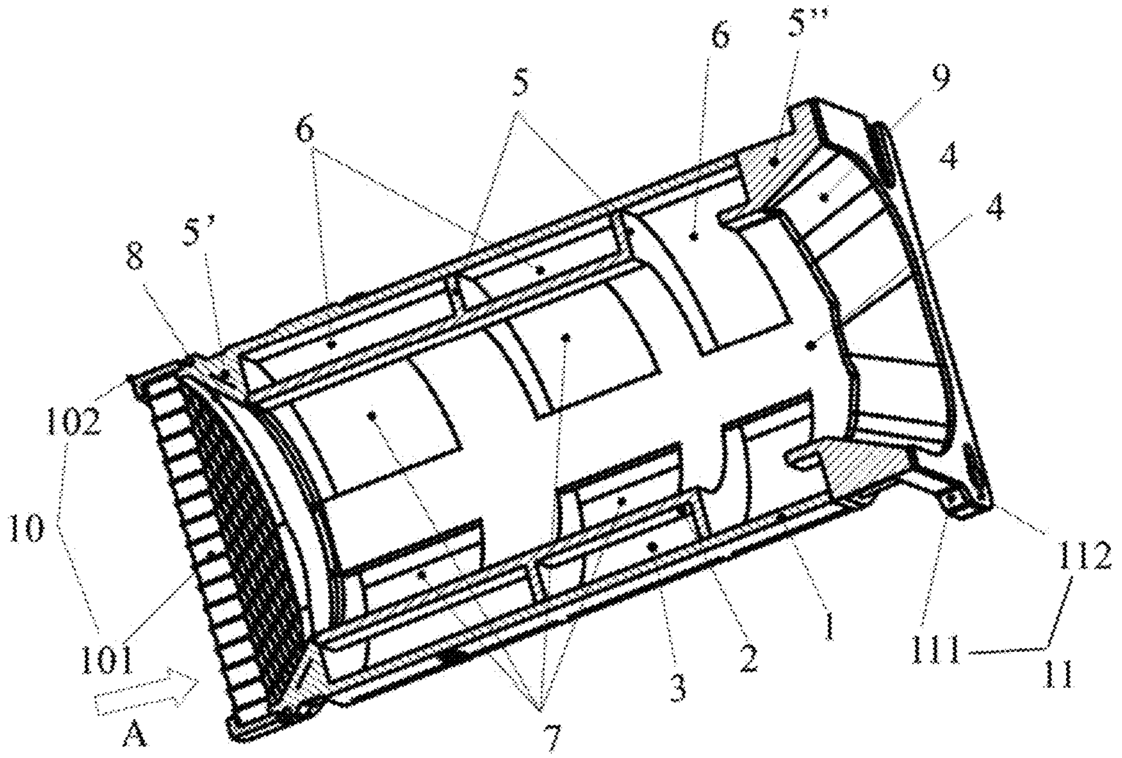
FIG. 1 is a schematic structural diagram of a silencer or muffler (broadly, a device) for reducing noise of a heat dissipation/cooling fan according to a first embodiment of the present disclosure.

Example embodiments will now be described more fully with reference to the accompanying drawings.

Disclosed herein are exemplary embodiments of silencers or mufflers (broadly, devices) operable for reducing noise of heat dissipation/cooling fans in electronic devices. Advantageously, the silencers or mufflers disclosed herein may solve the technical problem in that it is difficult to greatly improve the noise reduction of fan noise because there is no suitable solution for broadening the frequency band of the silencer/muffler due to the limited installation space in the current chassis of electronic devices.

In exemplary embodiments, a silencer or muffler for reducing noise of a heat dissipation/cooling fan includes an outer tube and at least one inner tube inside the outer tube. An annular space is formed between the inner and outer tubes. An inner cavity of the inner tube forms a ventilation channel. Partition plates are installed in the annular space that partition the annular space into silencing chambers arranged along a conveying direction of airflow. The inner tube includes openings communicating the silencing chambers with the ventilation channel. The silencing chambers are disposed correspondingly to silencing frequency bands. A limited installation space in an electronic device chassis can be used to achieve sound absorption and noise reduction for a heat dissipation fan in the silencing frequency bands. Accordingly, a limited installation space in a chassis of an electronic device can be used to achieve sound absorption and noise reduction of noise of the heat dissipation fan in a plurality of frequency bands. This not only ensures the heat dissipation ability of the heat dissipation fan, but also improves the normal read/write performance of a hard disk in a high-speed operation state of the heat dissipation fan.

In exemplary embodiments, the higher the silencing frequency band corresponding to the silencing chamber is, the larger the area of the opening correspondingly communicated is and/or the smaller the volume of the silencing chamber is. And the lower the silencing frequency band corresponding to the silencing chamber is, the lower the area of the opening correspondingly communicated is and/or the larger the volume of the silencing chamber is.

In exemplary embodiments, the plurality of the silencing chambers comprises a plurality of first silencing chambers. The number of openings correspondingly communicating with the first silencing chambers is in plural. And the plurality of openings are arranged at intervals along a circumferential direction of the silencing chambers corresponding to the openings.

In exemplary embodiments, the plurality of the first silencing chambers comprises at least one or more first silencing chambers having a silencing frequency band of 7500 Hz to 8500 Hz, at least one or more first silencing chambers having a silencing frequency band of 5500 Hz to 6500 Hz, at least one or more first silencing chambers having a silencing frequency band of 3000 Hz to 4000 Hz, and at least one or more first silencing chambers having a silencing frequency band of 1500 Hz to 2500 Hz. The plurality of first silencing chambers is arranged along the conveying direction of the airflow.

In alternative exemplary embodiments, the plurality of first silencing chambers comprises at least one or more first silencing chambers having a silencing frequency band of 3000 Hz to 4000 Hz, at least one or more first silencing chambers having a silencing frequency band of 5500 Hz to 6500 Hz, and at least one or more first silencing chambers having a silencing frequency band of 7500 Hz to 8500 Hz. The plurality of first silencing chambers is arranged along the conveying direction of the airflow.

In exemplary embodiments, the plurality of silencing chambers comprises at least one second silencing chamber. The number of the openings correspondingly communicating with the second silencing chamber is one. And the opening is an annular opening arranged and extending along the circumferential direction of the second silencing chamber corresponding to the opening.

In exemplary embodiments, the number of the second silencing chamber is one. Or the number of the second silencing chambers is in plural. And at least one of the first silencing chambers is arranged between two adjacent second silencing chambers.

In exemplary embodiments, the number of second silencing chambers is two, one of the second silencing chambers is disposed near an air inlet end of the ventilation channel, and the other of the second silencing chambers is disposed near an air outlet end of the ventilation channel, and the plurality of first silencing chambers are arranged between the two second silencing chambers.

In exemplary embodiments, the plurality of the silencing chambers comprises at least one or more second silencing chambers having a silencing frequency band of 8700 Hz to 9200 Hz, at least one or more first silencing chambers having a silencing frequency band of 3000 Hz to 4000 Hz, at least one or more first silencing chambers having a silencing frequency band of 5500 Hz to 6500 Hz, and at least one or more second silencing chambers having a silencing frequency band of 8000 Hz to 8500 Hz. The silencing chambers are arranged in sequence along the conveying direction of the airflow.

In alternative exemplary embodiments, the plurality of the silencing chambers comprise at least one or more second silencing chambers having a silencing frequency band of 8000 Hz to 8500 Hz, at least one or more first silencing chambers having a silencing frequency band of 5500 Hz to 6500 Hz, at least one or more second silencing chambers having a silencing frequency band of 8700 Hz to 9200 Hz, and at least one or more first silencing chambers having a silencing frequency band of 3000 Hz to 4000 Hz. The silencing chambers are arranged in sequence along the conveying direction of the airflow.

In exemplary embodiments, a silencing cotton or sound absorbing foam is laid on an inner wall surface of the outer tube in the second silencing chamber. The thickness of the silencing cotton or sound absorbing foam is smaller than a radial width of the annular space.

In exemplary embodiments, the air outlet end of the ventilation channel is communicated with an air inlet of the heat dissipation/cooling fan of a fan structure through a rear flow-guiding channel. The rear flow-guiding channel is tapered outwards along the conveying direction of the airflow. The air inlet end of the ventilation channel is communicated with a front flow-guiding channel. The front flow-guiding channel is tapered inwards along the conveying direction of the airflow.

In exemplary embodiments, a cellular mesh structure (e.g., honeycomb plate, etc.) is installed at an inlet of the front flow-guiding channel. And the rear flow-guiding channel is sealingly connected with the air inlet of the heat dissipation fan through a sealing structure.

In exemplary embodiments, the number of inner tubes is in plural. And the plurality of inner tubes is arranged in parallel and spaced apart inside the outer tube. A tube chamber of the outer tube is divided by at least one partition plate into a plurality of outer conduits. The plurality of inner tubes is disposed in the plurality of the outer conduits of the outer tube to form a plurality of the annular spaces. Each of the plurality of annular spaces is partitioned by the plurality of partition plates into the plurality of silencing chambers arranged along the conveying direction of the airflow.

Exemplary embodiments disclosed herein may provide one or more (but not necessarily any or all) of the following the features and advantages. In the silencer or muffler for reducing the noise of a heat dissipation/cooling fan according to exemplary embodiments of the present disclosure, the annular space formed between the inner tube and the outer tube is partitioned by the plurality of partition plates into the plurality of silencing chambers arranged along the conveying direction of the airflow. The plurality of silencing chambers is communicated with the ventilation channel through the plurality of openings provided in the inner tube. When the heat dissipation/cooling fan is operating, the airflow enters the ventilation channel and flows through the plurality of silencing chambers, re-enters the heat dissipation/cooling fan, and is discharged. Meanwhile, noise generated by the heat dissipation/cooling fan can be transmitted to the plurality of silencing chambers through the ventilation channel and the plurality of openings. And the sound energy of the heat dissipation/cooling fan noise in a plurality of frequency bands to be eliminated is dissipated in the plurality of silencing chambers, such that a limited installation space in a chassis of a server can be utilized to achieve sound absorption and noise reduction of the heat dissipation fan noise in the plurality of frequency bands. This not only ensures the heat dissipation ability of the heat dissipation fan, but also improves the normal read/write performance of a hard disk in a high-speed operation state of the heat dissipation fan. The structure of the silencer is relatively non-complicated, easy to manufacture, and the design is optimized.

With reference now to the figures, FIG. 1 illustrates a silencer or muffler (broadly, a device) for reducing noise of a heat dissipation/cooling fan according to an exemplary embodiment of the present disclosure. As shown in FIG. 1, the silencer includes an outer tube 1 and at least one inner tube 2 installed in the outer tube 1. An annular space 3 is formed between the inner tube 2 and the outer tube 1. An inner cavity of the inner tube 2 forms a ventilation channel 4. A plurality of partition plates 5 is installed in the annular space 3 and partitions the annular space 3 into a plurality of silencing chambers 6 arranged along a conveying direction of airflow. The inner tube 2 is provided with a plurality of openings 7 communicating the plurality of silencing chambers 6 with the ventilation channel 4. The plurality of silencing chambers 6 are arranged correspondingly to a plurality of silencing frequency bands. The silencing frequency band of each silencing chamber 6 is a frequency band of noise that can be eliminated by the silencing chamber 6.

The silencer according to the present disclosure is particularly suitable for use in a server to achieve sound absorption and noise reduction of fan noise generated by a heat dissipation fan 12 in the server. The server may be a general-purpose server classified according to product functions in the prior art, or may be a special-purpose server, such as a workstation, a GPU server, a high-density server, and a storage server.

Figure 2:
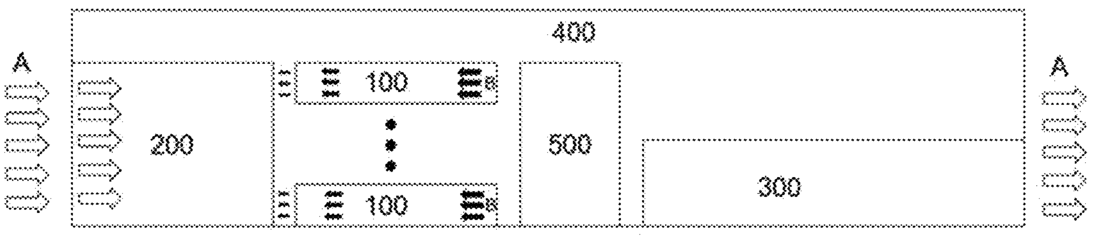
FIG. 2 is a schematic diagram of the arrangement of the silencer shown in FIG. 1.
Figure 3:
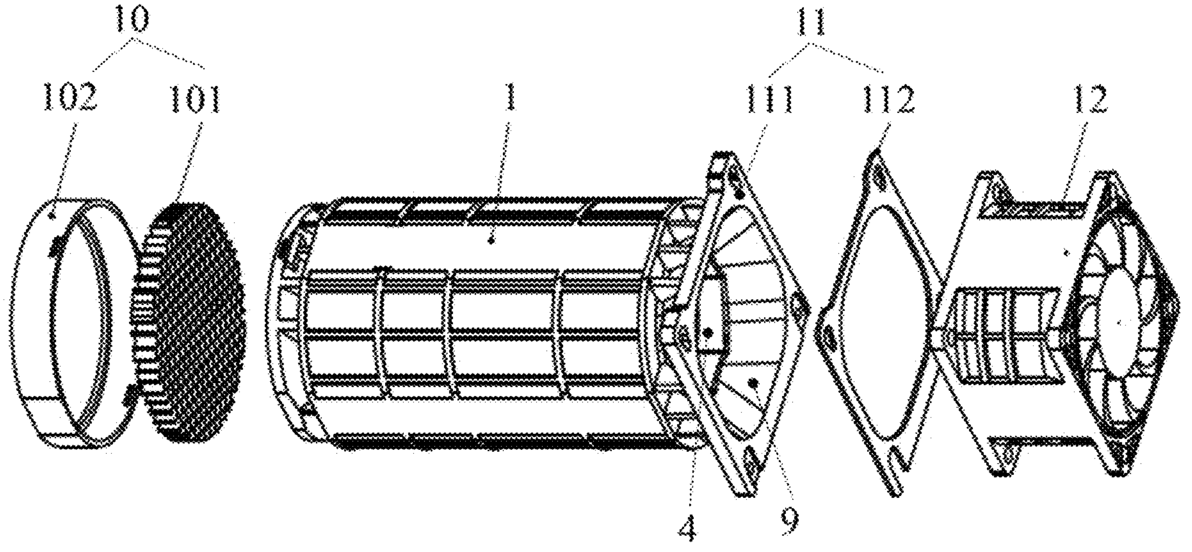
FIG. 3 is an exploded view of the silencer shown in FIG. 1.
Figure 4:
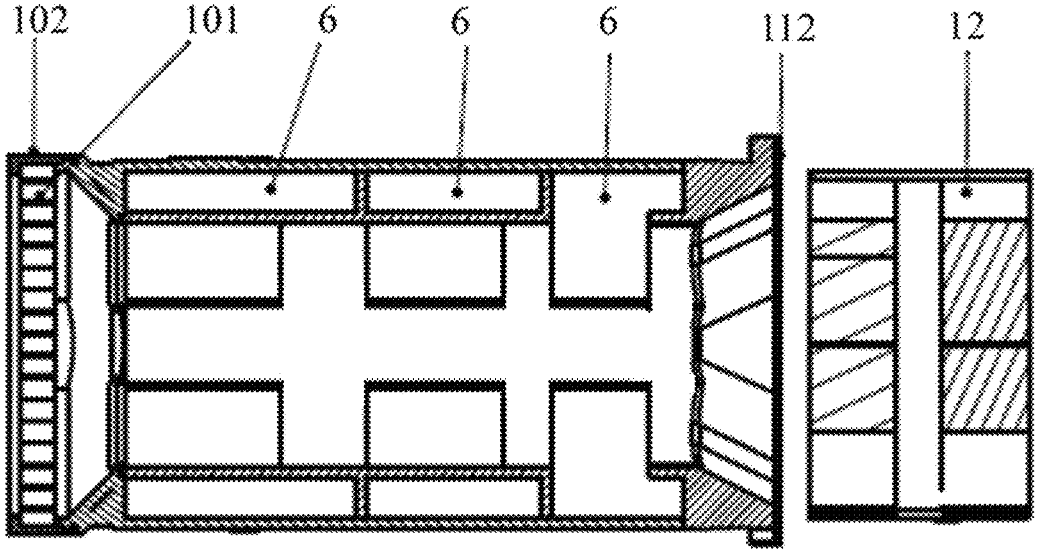
FIG. 4 is a schematic diagram of an installation of the silencer shown in FIG. 1.

With reference to FIGS. 2, 3 and 4, the server includes a chassis 400. A hard disk structure 200, a fan structure 500 and at least one silencer 100 are installed with the chassis 400. The at least one silencer 100 is located between the hard disk structure 200 and the fan structure 500. An air outlet of the ventilation channel 4 is communicated with an air inlet of at least one heat dissipation fan 12 of the fan structure 500. Other devices 300 are provided behind the fan structure 500. The fan structure 500 includes a plurality of heat dissipation fans 12. The hard disk structure 200 includes a plurality of hard disk modules. Each hard disk module accommodates at least one hard disk. The number of silencers is in plural, and the plurality of heat dissipation fans 12, the plurality of hard disk modules, and the plurality of silencers are disposed in one-to-one correspondence. The plurality of silencers may have the same structure or different structures. According to requirements, all or part of the plurality of silencers may be the same as a silencer according to an embodiment of the present disclosure. In addition to being installed between the hard disk structure 200 and the fan structure 500, the silencer 100 according to the present disclosure may also be installed between the fan structure 500 and another device 300 in the rear, or may be installed at another position around the fan structure 500 to eliminate environmental noise.

In the silencer according to the present disclosure, the annular space 3 formed between the inner tube 2 and the outer tube 3 is partitioned by the plurality of partition plates 5 into the plurality of silencing chambers 6 arranged along the conveying direction of the airflow. And the plurality of silencing chambers 6 are communicated with the ventilation channel 4 through the plurality of openings 7 provided in the inner tube 2. When the heat dissipation fan 12 is operating, airflow A enters the ventilation channel 4 and flows through the plurality of silencing chambers 6, re-enters the heat dissipation fan 12, and is discharged. Meanwhile, noise B generated by the heat dissipation fan 12 can be transmitted to the plurality of silencing chambers 6 through the ventilation channel 4 and the plurality of openings 7. And the sound energy of the heat dissipation fan 12 noise in a plurality of frequency bands to be eliminated is dissipated in the plurality of silencing chambers 6, such that a limited installation space in the chassis of the server can be utilized to achieve sound absorption and noise reduction of the heat dissipation fan noise in the plurality of frequency bands. This not only ensures the heat dissipation ability of the heat dissipation fan 12, but also improves the normal read/write performance of a hard disk in a high-speed operation state of the heat dissipation fan 12. The structure of the silencer is relatively simple, easy to manufacture, and the design is optimized. The silencer according to the present disclosure can also produce the same technical effect even when applied to an electronic device provided with a hard disk, such as a memory, a computer, or the like.

To fully utilize the installation space in the chassis, dimensional parameters of the silencer are defined according to the present disclosure. Specifically, the length of the silencer is less than or equal to the length of the spacing space between the fan structure and the hard disk structure. The diameter of the ventilation channel 4 is equal to the diameter of the air inlet of the heat dissipation fan 12 of the fan structure, or the diameter of the ventilation channel 4 may be slightly smaller than the diameter of the air inlet. But it is necessary to ensure that the air inlet volume and the heat dissipation efficiency are not affected.

With reference to FIGS. 3 and 4, to guide heat dissipation airflow formed after absorbing the heat of the hard disk into the ventilation channel 4, an air inlet end of the ventilation channel 4 is communicated with a front flow-guiding channel 8. The front flow-guiding channel 8 is tapered inwards along the conveying direction of the airflow. A cellular mesh structure 10 (e.g., honeycomb plate, etc.) is installed at an inlet of the front flow-guiding channel 8 to assist in noise reduction and further improve the effect of flow guidance. To guide the noise of the heat dissipation fan 12 into the silencing chamber 6 through the ventilation channel 4, an air outlet end of the ventilation channel 4 is communicated with the air inlet of the heat dissipation fan 12 through a rear flow-guiding channel 9. The rear flow-guiding channel 9 is tapered outwards along the conveying direction of the airflow. To prevent the airflow and the noise of the heat dissipation fan 12 from leaking out through the installation gap between the silencer and the heat dissipation fan 12, the rear end of the silencer is provided with a sealing structure 11, and the silencer is sealingly connected to the air inlet of the heat dissipation fan 12 through the sealing structure 11.

The outer tube 1 and the at least one inner tube 2 each have a substantially straight cylindrical tube structure. The conveying direction of the airflow is also the axial direction of the at least one inner tube 2 and the outer tube 1. The plurality of partition plates 5 are arranged at intervals along the conveying direction of the airflow. A silencing chamber 6 is formed between two adjacent partition plates 5. The outer tube 1 and the at least one inner tube 2 have opposite front and rear ends in the conveying direction of the airflow. The rear end of the outer tube 1 is connected to the rear end of the at least one inner tube 2 through a partition plate 5'' arranged at the rearmost position. An inner cavity of the partition plate 5'' forms the rear flow-guiding channel 9 and is sealingly connected to the air inlet of the heat dissipation fan 12 through the sealing structure 11. The sealing structure 11 includes a mounting plate 111 connected to the partition plate 5'' arranged at the rearmost position, and a sealing ring, a sealant or another sealing member 112. The mounting plate 111 is fixed to a fixing plate at the front end of the heat dissipation fan 12 by means of screws or other mechanical fasteners. The front end of the outer tube 1 is connected to the front end of the at least one inner tube 2 through a partition plate 5' arranged at the foremost position. An inner cavity of the partition plate 5' forms the front flow-guiding channel 8.

Figure 5:
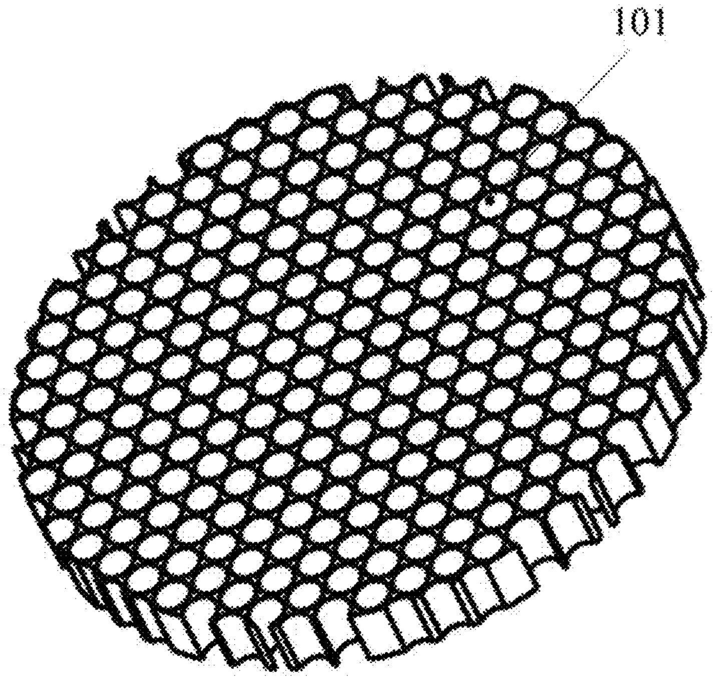
FIG. 5 is a schematic structural diagram of a cellular mesh plate according to the present disclosure.

With reference to FIG. 5, the cellular mesh structure 10 includes a cellular mesh plate 101 and a cover plate 102, and the cover plate 102 presses and fixes the cellular mesh plate 101 to the front end of the partition plate 5' arranged at the foremost position. A partition plate 5 located in a middle region has a substantially annular plate structure.

Figure 7:
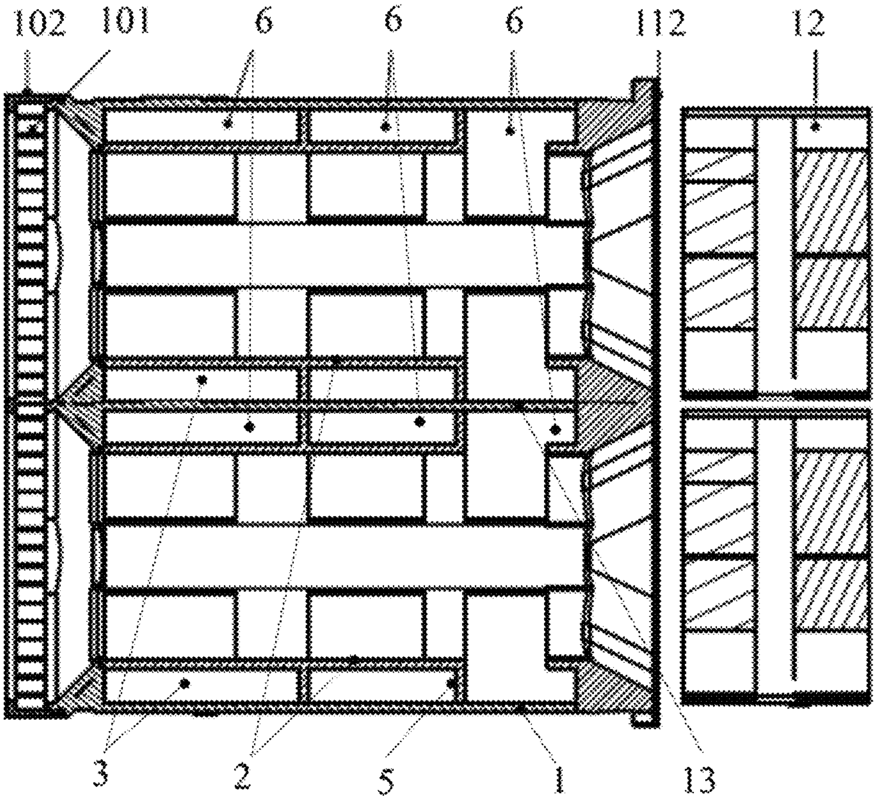
FIG. 7 is a schematic structural diagram of arranging a plurality of inner tubes in a main tube according to the present disclosure.

As shown in FIG. 7, in some other embodiments of the present disclosure, the number of inner tubes 2 is in plural, and the plurality of inner tubes 2 are arranged in parallel and at intervals in the outer tube 1. A tube chamber of the outer tube 1 is divided by at least one partition plate 13 into a plurality of outer conduits. The plurality of inner tubes 2 is disposed in the plurality of outer conduits of the outer tube 1 to form a plurality of annular spaces 3. Each of the plurality of annular spaces is partitioned by partition plates 5 into a plurality of silencing chambers 6 arranged along the conveying direction of the airflow. The silencing frequencies of the plurality of silencing chambers 6 formed by partitioning the annular spaces 3 may be the same or different.

Forming a plurality of groups of silencing chambers 6 arranged in parallel by fitting a plurality of inner tubes 2 with one outer tube 1 is advantageous for reducing the cost and the occupied space compared with the case where two outer tubes 1 are arranged at intervals, thereby helping to meet the demand for increasingly thinner and lighter electronic devices. The plurality of inner tubes 2 may be arranged side by side in a horizontal direction, or may be arranged in a vertical direction and disposed correspondingly to multilayer hard disk modules arranged in the vertical direction.

In exemplary embodiments, by designing the area of the openings 7 corresponding to the plurality of silencing chambers 6 and/or the volume of the silencing chambers 6, the silencing frequency bands corresponding to the plurality of silencing chambers 6 can be designed so that the silencing effect of the silencer according to the present disclosure meets design requirements. By changing the area of the openings 7 and/or the volume of the silencing chambers 6, the silencing frequency bands corresponding thereto can be adjusted.

The higher the silencing frequency band corresponding to the silencing chamber 6 is, the larger the area corresponding to the opening 7 correspondingly communicated is. And the lower the silencing frequency band corresponding to the silencing chamber 6 is, the lower the area corresponding to the opening 7 correspondingly communicated is. The higher the silencing frequency band corresponding to the silencing chamber 6 is, the smaller the volume of the silencing chamber 6 is. And the lower the silencing frequency band corresponding to the silencing chamber 6 is, the larger the volume of the silencing chamber 6 is.

Figure 8:
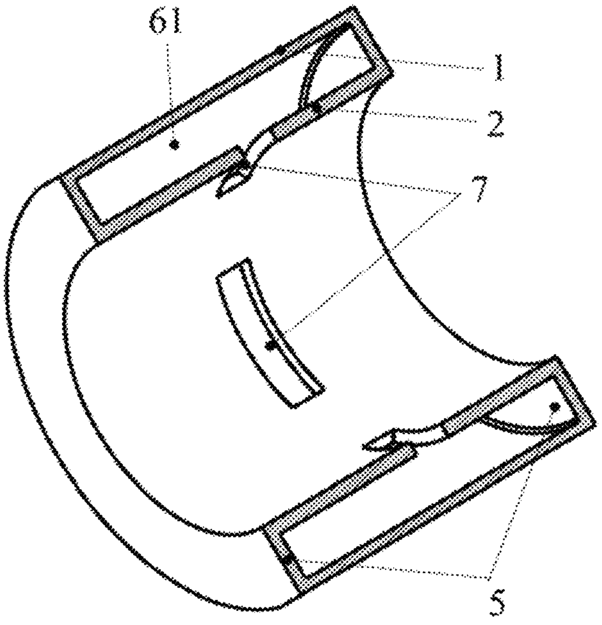
FIG. 8 is a schematic structural diagram of a first silencing chamber according to an embodiment of the present disclosure.
Figure 9:
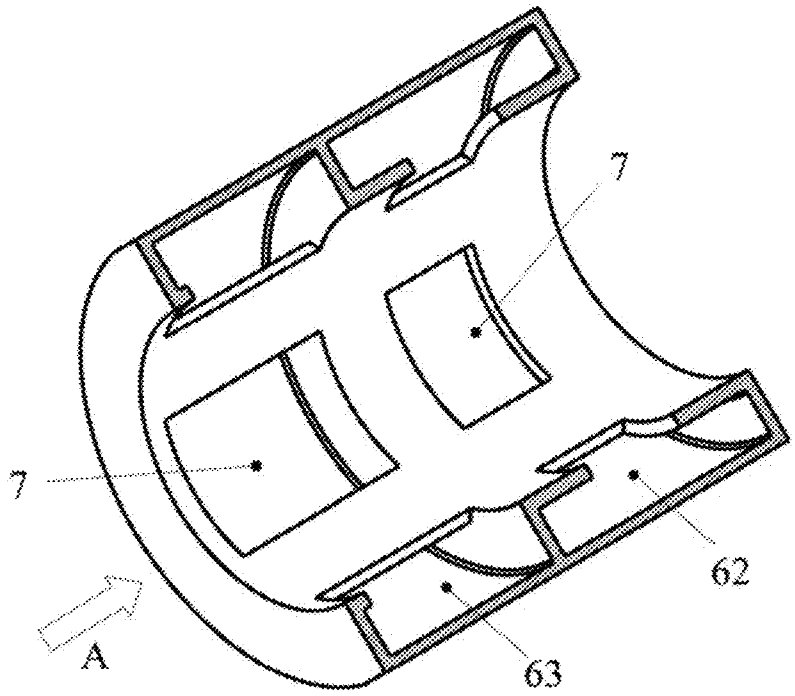
FIG. 9 is a schematic structural diagram of two first silencing chambers according to a second embodiment of the present disclosure.
Figure 11:
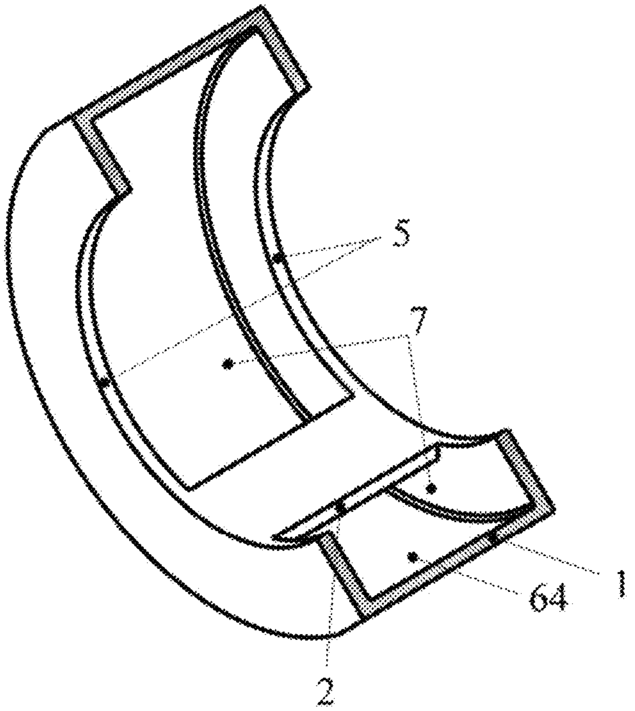
FIG. 11 is a schematic structural diagram of another first silencing chamber according to an embodiment of the present disclosure.

As shown in FIGS. 8, 9 and 11, in some embodiments of the present disclosure, the plurality of silencing chambers 6 include at least one first silencing chamber. The number of openings 7 correspondingly communicating with the first silencing chamber is in plural, and the plurality of openings 7 are arranged at intervals along the circumferential direction of the silencing chambers 6 corresponding thereto.

When the diameter of the inner tube 2 and the diameter of the outer tube 1 are constant, according to the present disclosure, by changing the size of each opening 7, and/or changing the distance between two partition plates 5, the radial dimension of each silencing chamber 6 is constant, and only the size of the opening 7 and/or the axial dimension of the silencing chamber 6 are changed, thereby designing a plurality of first silencing chambers having different silencing frequency bands.

As shown in FIG. 8, a first silencing chamber 61 having a silencing frequency band of 1500 Hz to 2500 Hz is designed by adjusting the area of the opening 7 and the volume of the silencing chamber 6.

As shown in FIG. 9, a first silencing chamber 62 having a silencing frequency band of 3000 Hz to 4000 Hz is designed by increasing the area of the opening 7 and reducing the volume of the silencing chamber 6.

As shown in FIG. 9, a first silencing chamber 63 having a silencing frequency band of 5500 Hz to 6500 Hz is designed by further increasing the area of the opening 7 and appropriately reducing the volume of the silencing chamber 6.

As shown in FIG. 11, a first silencing chamber 64 having a silencing frequency band of 7500 Hz to 8500 Hz is designed by further increasing the area of the opening 7 and appropriately reducing the volume of the silencing chamber 6.

Figure 14:
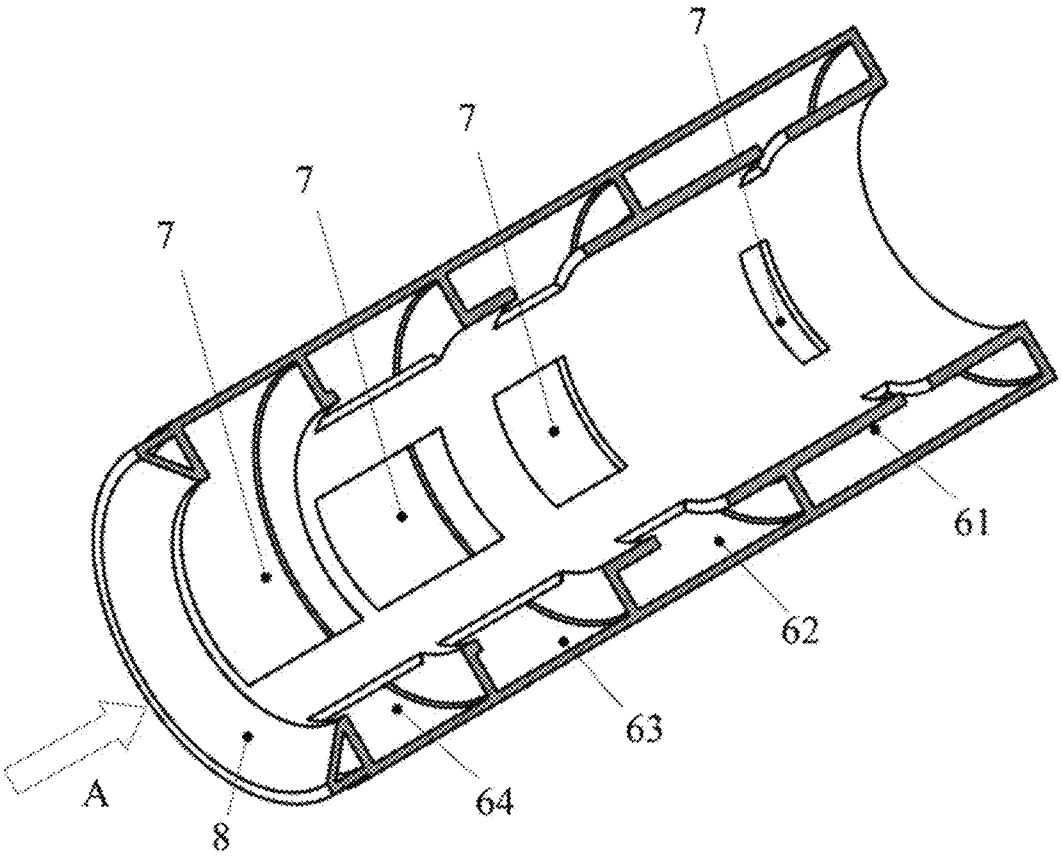
FIG. 14 is a schematic structural diagram of a silencer according to a third embodiment of the present disclosure.
Figure 16:
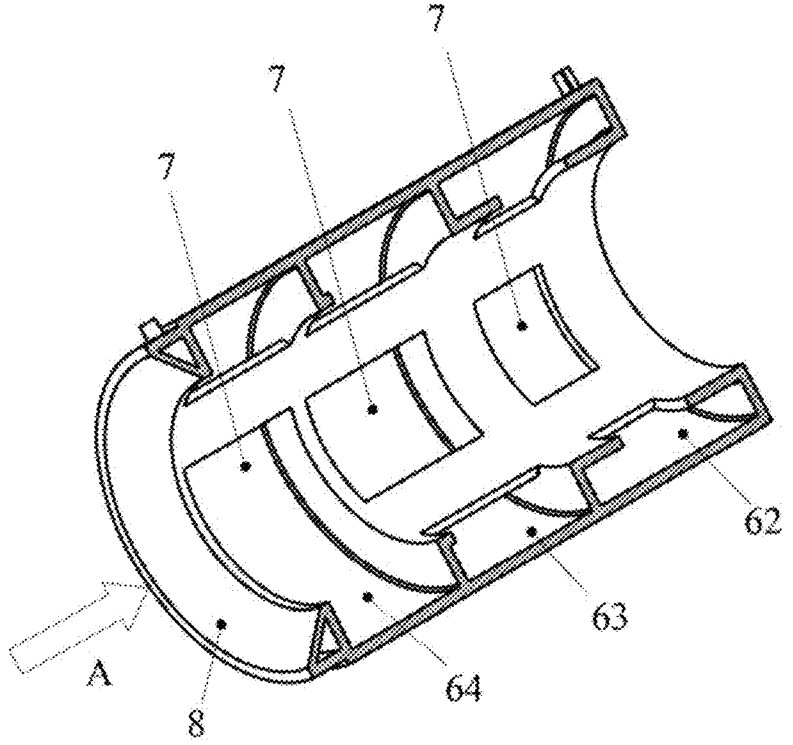
FIG. 16 is a schematic structural diagram of a silencer according to a fourth embodiment of the present disclosure.

As shown in FIGS. 1, 14, and 16, in some embodiments of the present disclosure, each silencing chamber 6 of the silencer is a first silencing chamber.

Figure 17:
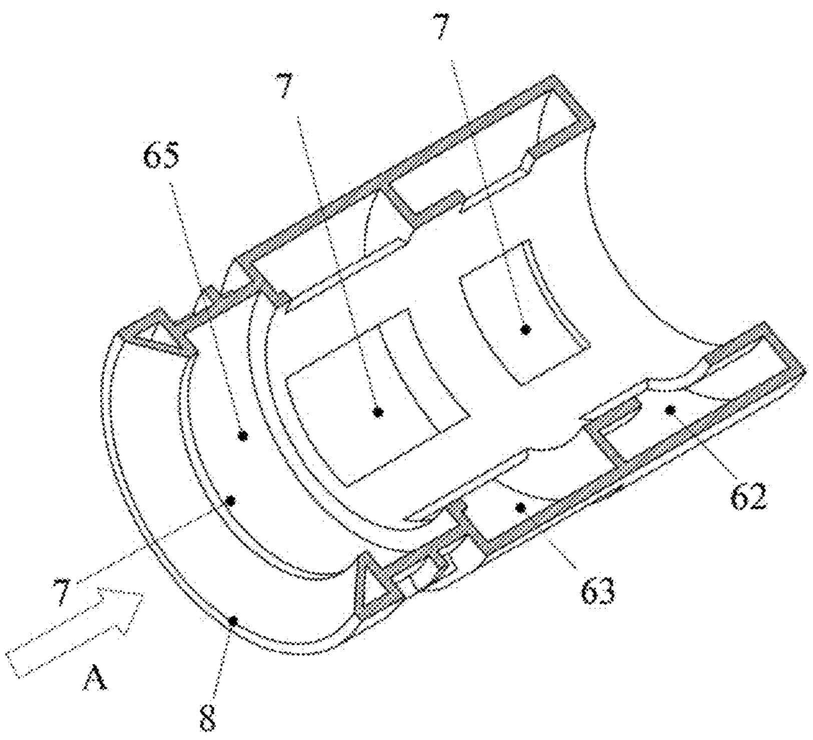
FIG. 17 is a schematic structural diagram of a silencer according to a fifth embodiment of the present disclosure.
Figure 19:
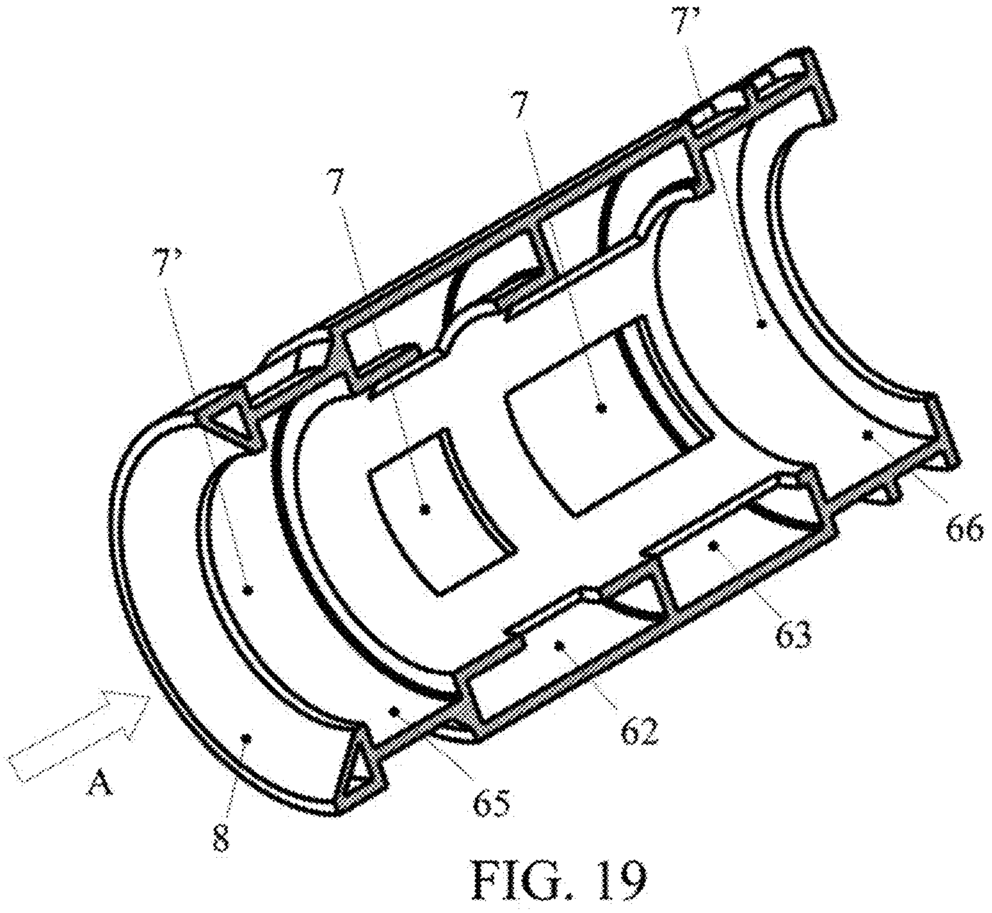
FIG. 19 is a schematic structural diagram of a silencer according to a sixth embodiment of the present disclosure.
Figure 21:
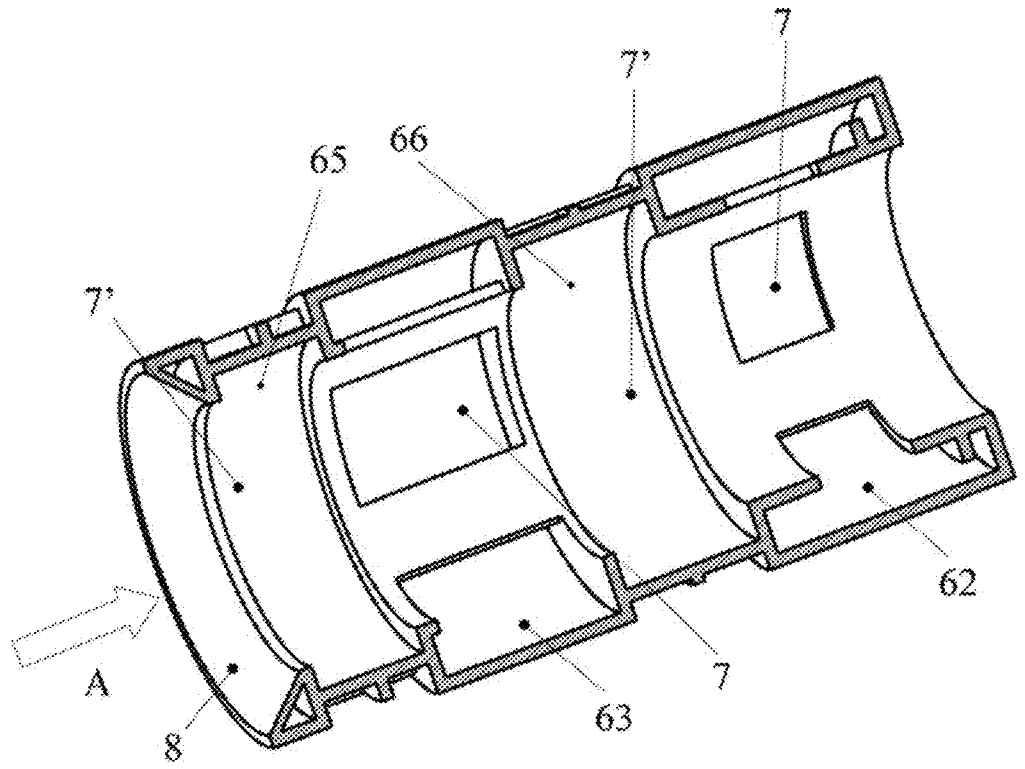
FIG. 21 is a schematic structural diagram of a silencer according to a seventh embodiment of the present disclosure.

As shown in FIGS. 17, 19 and 21, in other embodiments of the present disclosure, the plurality of silencing chambers 6 may further include at least one second silencing chamber. The number of openings 7 correspondingly communicated with the second silencing chamber is one, and the opening 7 is an annular opening 7' extending along the circumferential direction of the silencing chamber 6 corresponding thereto.

Because the opening 7 corresponding to the second silencing chamber is an annular opening 7', that is, the space between the inner edges of two adjacent partition plates 5 directly forms an annular opening 7', according to the present disclosure, the volume of the silencing chamber 6 and the size of the opening 7 can be changed by changing the diameter of the outer tube 1, the ring width of the partition plates 5, and the distance between the two partition plates 5, thereby designing a plurality of second silencing chambers having different silencing frequency bands.

Figure 12:
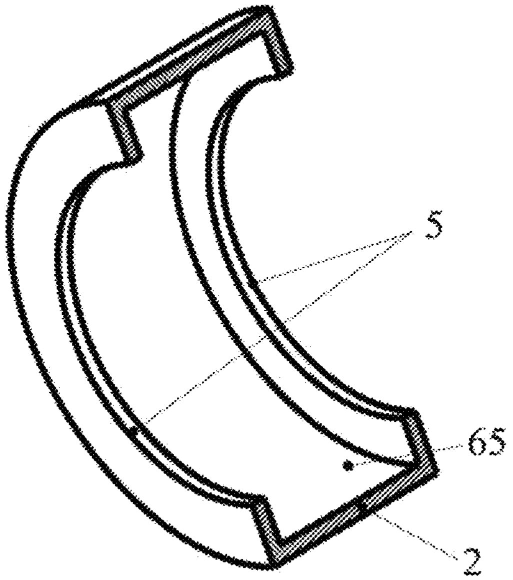
FIG. 12 is a schematic structural diagram of a second silencing chamber according to an embodiment of the present disclosure.

As shown in FIG. 12, a second silencing chamber 65 having a silencing frequency band of 8000 Hz to 8500 Hz is designed by adjusting the diameter of the outer tube 1 and the distance between two partition plates 5.

Figure 13:
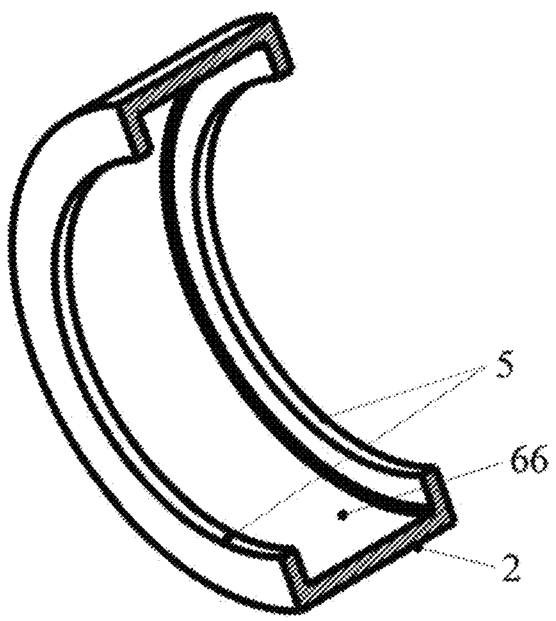
FIG. 13 is a schematic structural diagram of another second silencing chamber according to an embodiment of the present disclosure.

As shown in FIG. 13, a second silencing chamber 66 having a silencing frequency band of 8700 Hz to 9200 Hz is designed by increasing the diameter of the outer tube 1 and reducing the distance between the two partition plates 5.

To improve the silencing effect of medium-high frequency silencing chambers, a silencing cotton is laid on an inner wall surface of the outer tube in the second silencing chamber, and the thickness of the silencing cotton is smaller than the radial width of the annular space. Selection is performed according to a sound absorption coefficient curve of the silencing cotton, and when the frequency band corresponding to a higher sound absorption coefficient of a silencing cotton is consistent with the silencing frequency band of the second silencing chamber of the silencer, the silencing cotton may be selected. In consideration of the influence of the porosity of the silencing cotton on the volume of the second silencing chamber, the specific thickness of the silencing cotton in the second silencing chamber may be determined according to the combined noise reduction effect of the silencing cotton and the second silencing chamber.

In the silencer according to the present disclosure, a plurality of silencing chambers 6 having different silencing frequency bands may be arranged in combination in the conveying direction of the airflow according to requirements. To further optimize the silencing effect of the silencer of the present disclosure, the arrangement order of the plurality of silencing chambers 6 in the conveying direction of the airflow may be adjusted. Further, the silencing frequencies of the silencing chambers arranged in combination may be adjusted to ensure that the silencing effect of each silencing chamber is not significantly attenuated by the arrangement in combination with other silencing chambers.

When each silencing chamber of the silencer is a first silencing chamber, to ensure the silencing effect of each first silencing chamber, as shown in FIG. 1, in some embodiments of the present disclosure, a plurality of first silencing chambers having silencing frequency bands from low to high are arranged along the conveying direction of the airflow.

Figure 6:
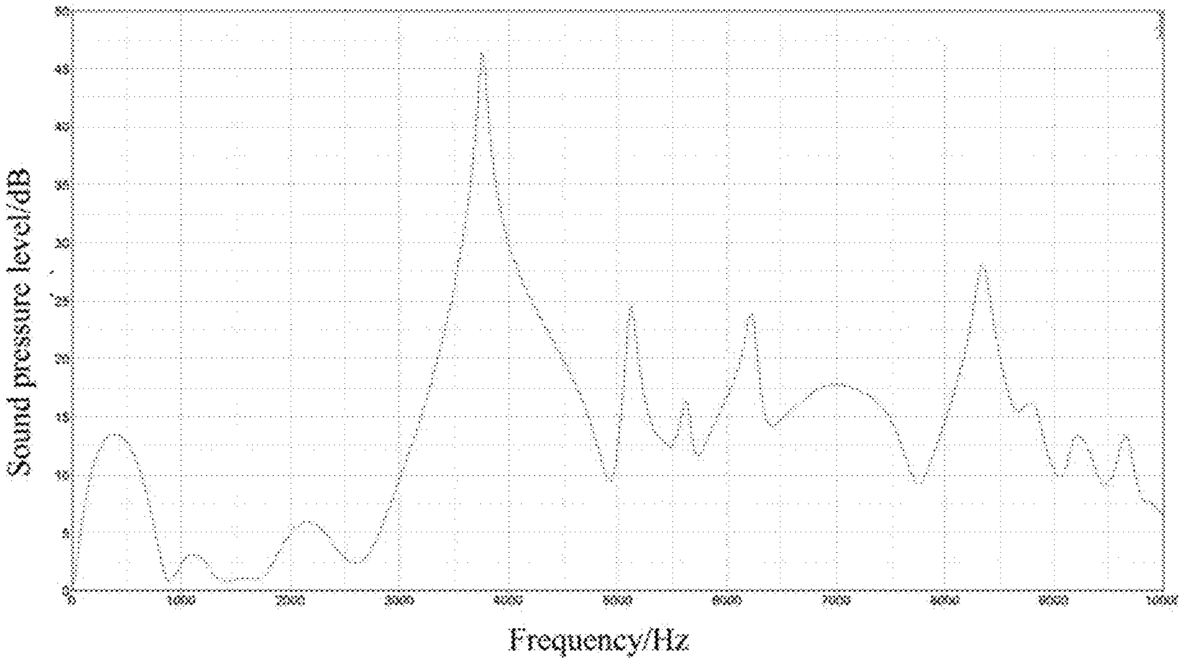
FIG. 6 is a sound pressure level response line graph of sound pressure level in decibels (dB) versus frequency in hertz (Hz) of a silencer according to the first embodiment of the present disclosure.

As shown in FIG. 1, in a first embodiment, the number of silencing chambers is three. The first silencing chamber has a silencing frequency band of 3000 Hz to 4000 Hz, the second silencing chamber has a silencing frequency band of 5500 Hz to 6500 Hz, and the third silencing chamber 62 has a silencing frequency band of 7500 Hz to 8500 Hz. With reference to FIG. 6, it can be seen that the silencer according to the present embodiment has a good silencing effect for each of the various silencing frequency bands described above.

Figure 10:
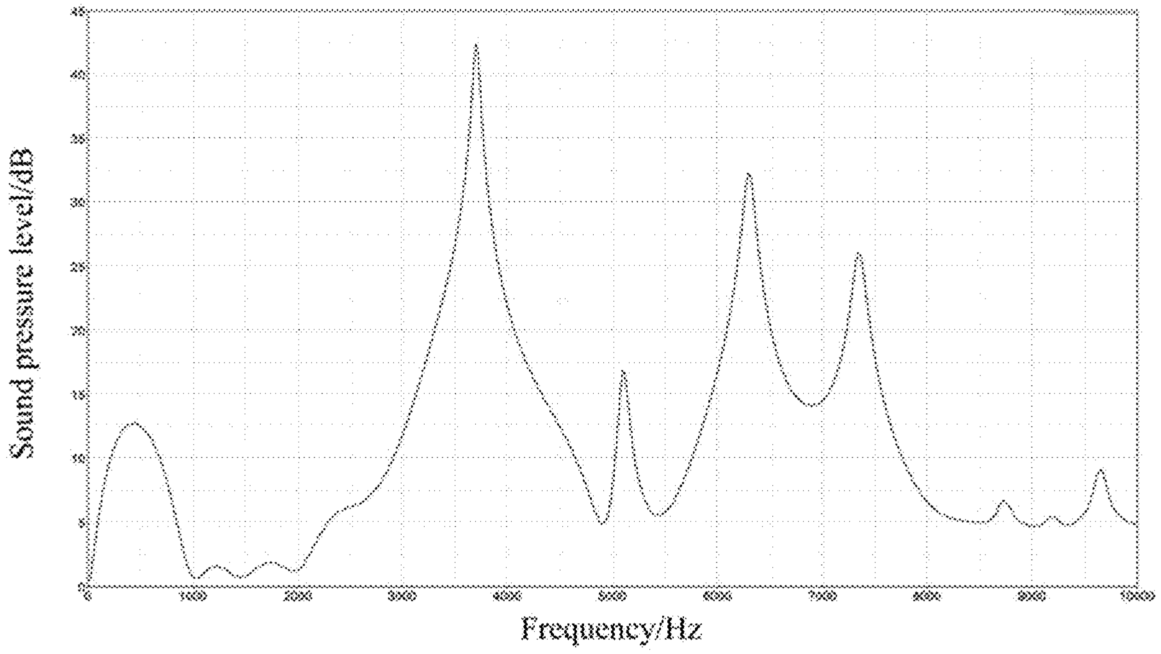
FIG. 10 is a sound pressure level response line graph of sound pressure level in decibels (dB) versus frequency in hertz (Hz) of a silencer according to the second embodiment of the present disclosure.

As shown in FIGS. 9, 12 and 16, in some embodiments of the present disclosure, a plurality of first silencing chambers having silencing frequency bands from high to low are arranged along the conveying direction A of the airflow. As shown in FIG. 9, in a second embodiment, the number of silencing chambers is two. The first silencing chamber 63 has a silencing frequency band of 5500 Hz to 6500 Hz, and the second silencing chamber 62 has a silencing frequency band of 3000 Hz to 4000 Hz. With reference to FIG. 10, it can be seen that the silencer according to the present embodiment has a good silencing effect for each of the various silencing frequency bands described above.

Figure 15:
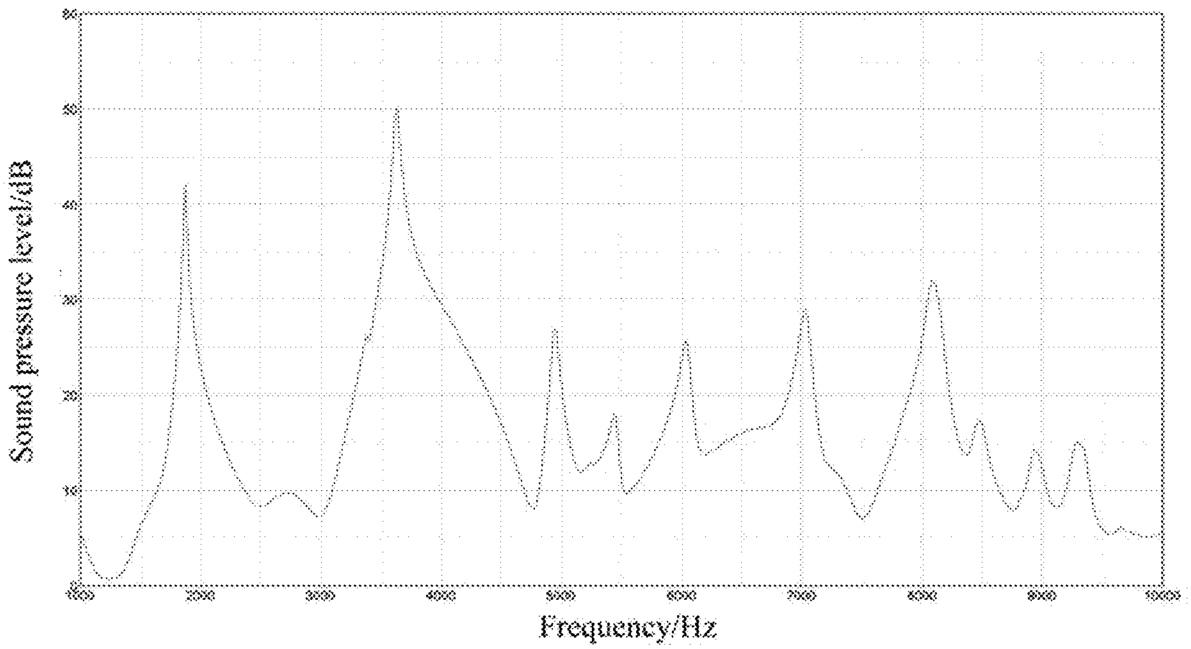
FIG. 15 is a sound pressure level response line graph of sound pressure level in decibels (dB) versus frequency in hertz (Hz) of a silencer according to the third embodiment of the present disclosure.

As shown in FIG. 14, in a third embodiment, the number of silencing chambers is four. The first silencing chamber 64 has a silencing frequency band of 7500 Hz to 8500 Hz, the second silencing chamber 63 has a silencing frequency band of 5500 Hz to 6500 Hz, the third silencing chamber 62 has a silencing frequency band of 3000 Hz to 4000 Hz, and the fourth silencing chamber 61 has a silencing frequency band of 1500 Hz to 2500 Hz. With reference to FIG. 15, it can be seen that the silencer according to the present embodiment has a good silencing effect for each of the various silencing frequency bands described above.

As shown in FIG. 16, in a fourth embodiment, the number of silencing chambers is three. The first silencing chamber 64 has a silencing frequency band of 7500 Hz to 8500 Hz, the second silencing chamber 63 has a silencing frequency band of 5500 Hz to 6500 Hz, and the third silencing chamber 62 has a silencing frequency band of 3000 Hz to 4000 Hz.

As shown in FIG. 17, in some embodiments of the present disclosure, the number of second silencing chambers is one. Further, the second silencing chamber is preferably disposed near the air inlet end of the ventilation channel 4 or near the air outlet end of the ventilation channel 4. In the fifth embodiment shown in FIG. 17, the number of silencing chambers is three, the first silencing chamber 65 has a silencing frequency band of 8700 Hz to 9200 Hz, the second silencing chamber 63 has a silencing frequency band of 5500 Hz to 6500 Hz, and the third silencing chamber 62 has a silencing frequency band of 3000 Hz to 4000 Hz.

Figure 18:
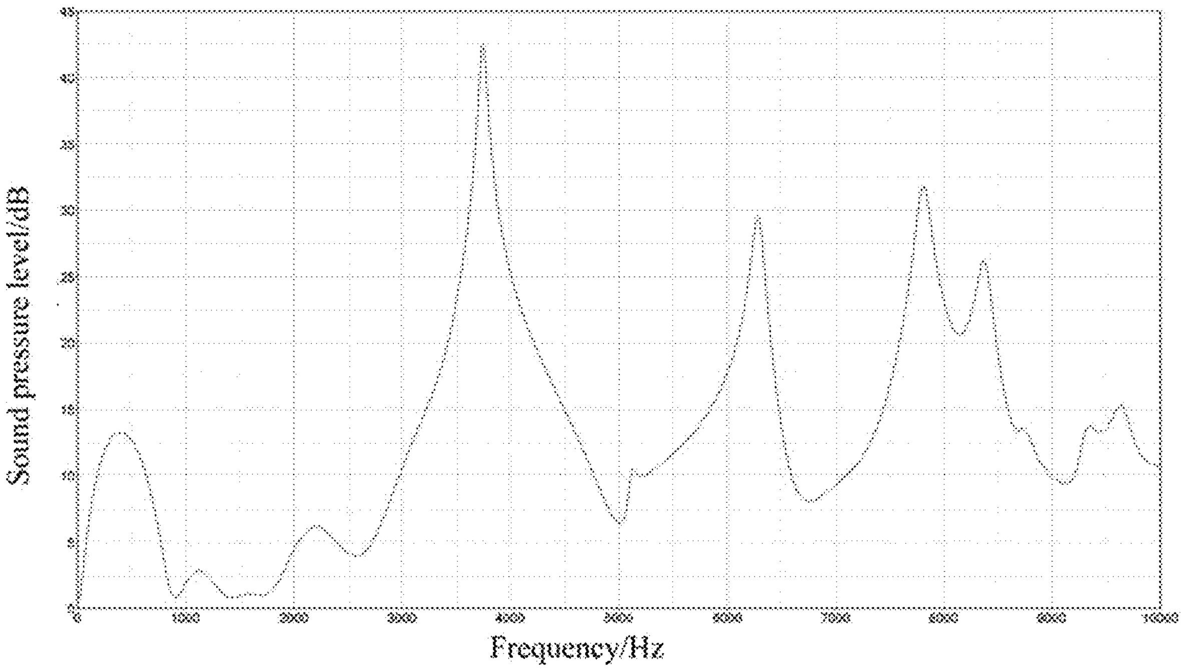
FIG. 18 is a sound pressure level response line graph of sound pressure level in decibels (dB) versus frequency in hertz (Hz) of a silencer according to the fifth embodiment of the present disclosure.

With reference to FIG. 18, it can be seen that the silencer according to the present embodiment has a good silencing effect for each of various silencing frequency bands described above. It can be seen from a comparison between FIGS. 10 and 18 that in the present embodiment, compared with the second embodiment, the added medium-high frequency silencing chamber having the silencing frequency band of 8700 Hz to 9200 Hz can produce a relatively significant silencing effect, and the silencing effect of the first silencing chamber having the silencing frequency band of 3000 Hz to 4000 Hz and the first silencing chamber having the silencing frequency band of 5500 Hz to 6500 Hz is not significantly attenuated.

When the silencer is also provided with a plurality of second silencing chambers in order to eliminate noise in a plurality of medium-high frequency bands, as shown in FIGS. 19 and 21, to ensure the silencing effect of each of the second silencing chambers, in exemplary embodiments, the plurality of second silencing chambers are not arranged adjacent to each other. Therefore, at least one first silencing chamber is arranged between two adjacent medium-high frequency silencing chambers, thereby preventing the silencing effect of one or more medium-high frequency silencing chambers from being significantly attenuated due to the arrangement of the plurality of medium-high frequency silencing chambers close to each other.

As shown in FIG. 19, in still other embodiments of the present disclosure, a second silencing chamber 65 is disposed near the air inlet end of the ventilation channel 4, another second silencing chamber 66 is disposed near the air outlet end of the ventilation channel 4, and a plurality of first silencing chambers are arranged between the two second silencing chambers. In the sixth embodiment shown in FIG. 19, the number of silencing chambers is four, the first silencing chamber 65 has a silencing frequency band of 8700 Hz to 9200 Hz, the second silencing chamber 62 has a silencing frequency band of 3000 Hz to 4000 Hz, the third silencing chamber 63 has a silencing frequency band of 5500 Hz to 6500 Hz, and the fourth silencing chamber 66 has a silencing frequency band of 8000 Hz to 8500 Hz.

Figure 20:
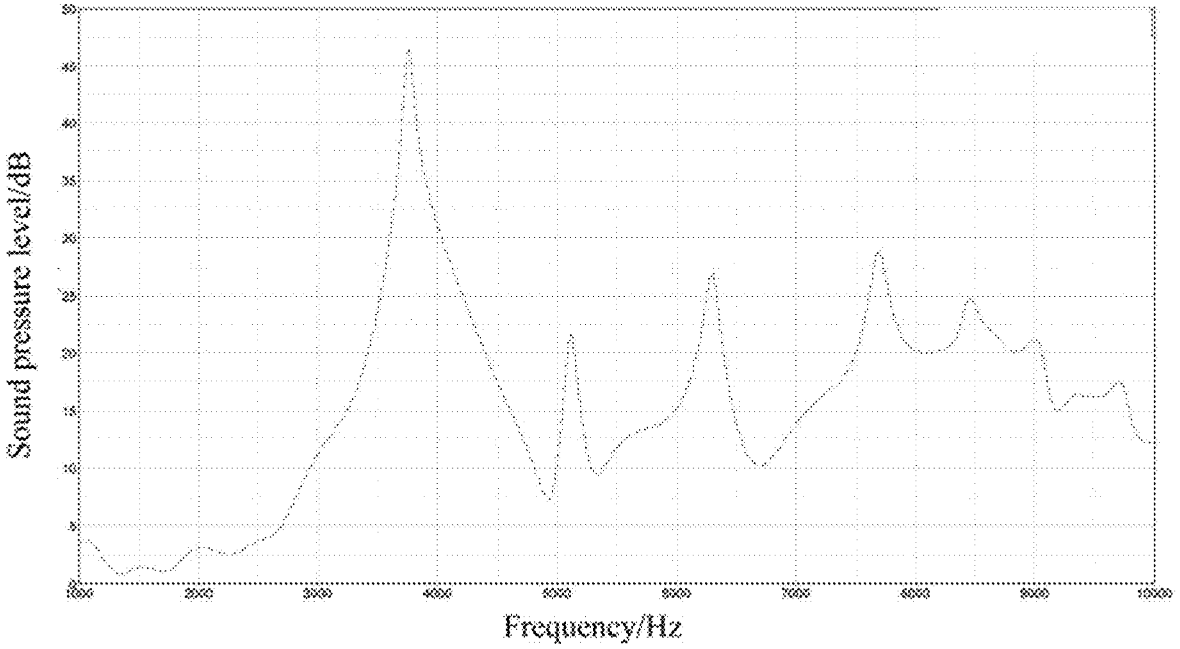
FIG. 20 is a sound pressure level response line graph of sound pressure level in decibels (dB) versus frequency in hertz (Hz) of a silencer according to the sixth embodiment of the present disclosure.

With reference to FIG. 20, it can be seen that the silencer according to the present embodiment has a good silencing effect for each of the various silencing frequency bands described above. It can be seen by comparison between FIGS. 10 and 20 that, in the present embodiment, compared with the second embodiment, the added medium-high frequency silencing chamber having the silencing frequency band of 8700 Hz to 9200 Hz and the medium-high frequency silencing chamber having the silencing frequency band of 8000 Hz to 8500 Hz can produce a relatively significant silencing effect, and the silencing effect of the first silencing chamber having the silencing frequency band of 3000 Hz to 4000 Hz and the first silencing chamber having the silencing frequency band of 5500 Hz to 6500 Hz is not significantly attenuated.

Figure 22:
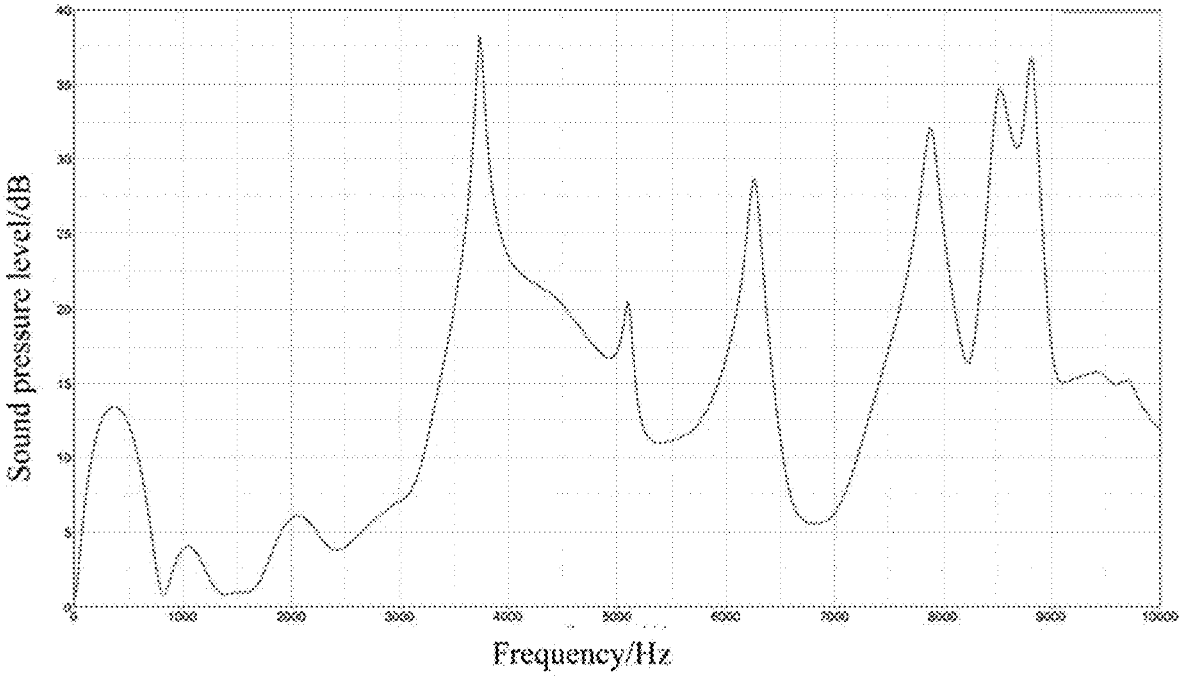
FIG. 22 is a sound pressure level response line graph of sound pressure level in decibels (dB) versus frequency in hertz (Hz) of a silencer according to the seventh embodiment of the present disclosure.
Figure 23:
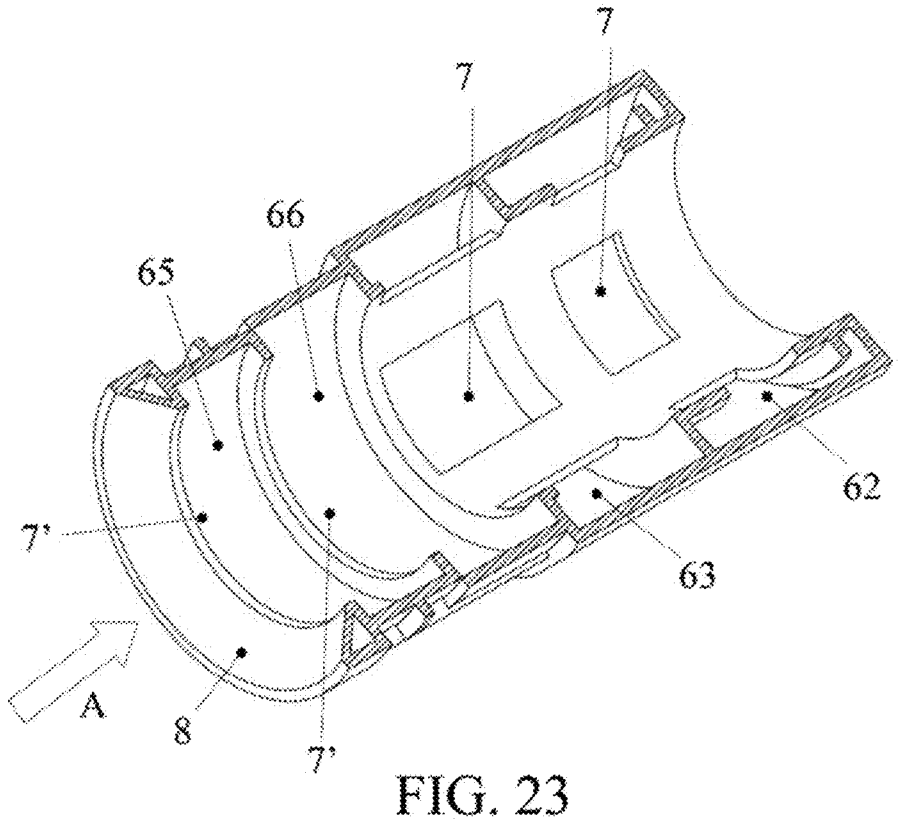
FIG. 23 is a schematic structural diagram of a silencer according to a first comparative example of the present disclosure.
Figure 24:
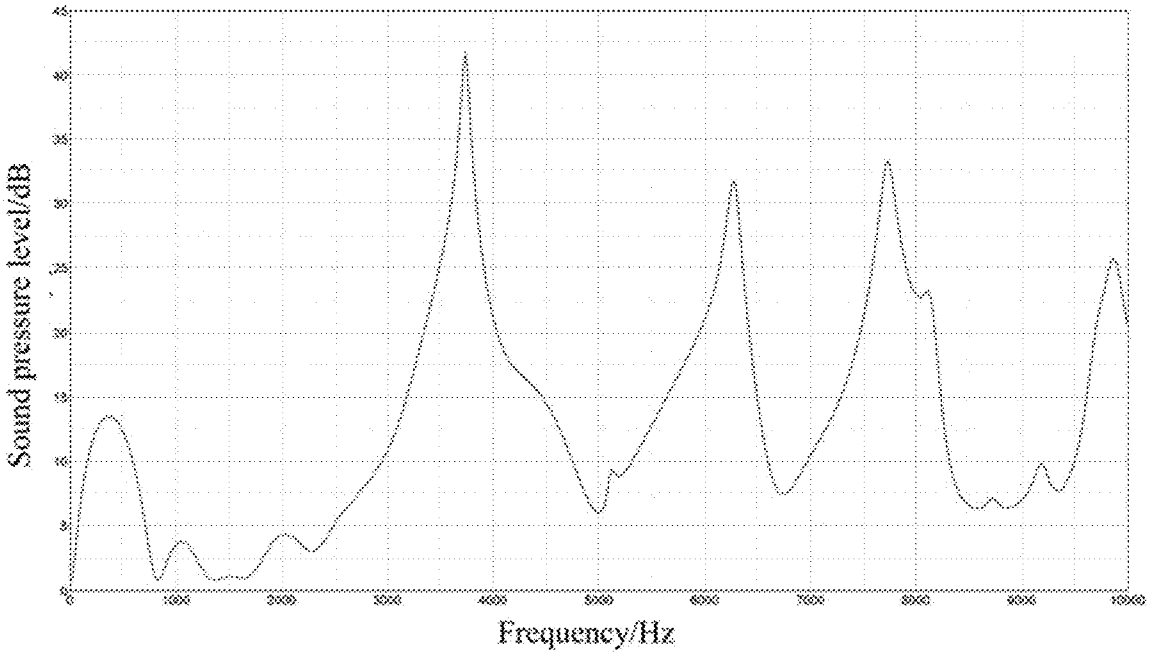
FIG. 24 is a sound pressure level response line graph of sound pressure level in decibels (dB) versus frequency in hertz (Hz) of a silencer according to the first comparative example of the present disclosure.

As shown in FIG. 21, in still other embodiments of the present disclosure, a plurality of second silencing chambers and a plurality of first silencing chambers are alternately arranged one by one along the conveying direction of the airflow. In the seventh embodiment shown in FIG. 21, the number of silencing chambers 6 is three, the first silencing chamber 65 has a silencing frequency band of 8000 Hz to 8500 Hz, the second silencing chamber 63 has a silencing frequency band of 5500 Hz to 6500 Hz, the third silencing chamber 66 has a silencing frequency band of 8700 Hz to 9200 Hz, and the fourth silencing chamber 62 has a silencing frequency band of 3000 Hz to 4000 Hz. With reference to FIG. 22, it can be seen that the silencer according to the present embodiment has a good silencing effect for each of the various silencing frequency bands described above. It can be seen from a comparison between FIGS. 10 and 23 that, in the present embodiment, compared with the second embodiment, the added medium-high frequency silencing chamber having the silencing frequency band of 8700 Hz to 9200 Hz and the medium-high frequency silencing chamber having the silencing frequency band of 8000 Hz to 8500 Hz can produce a significant silencing effect, and the silencing effect of the first silencing chamber having the silencing frequency band of 3000 Hz to 4000 Hz and the first silencing chamber having the silencing frequency band of 5500 Hz to 6500 Hz is not significantly attenuated. As shown in FIG. 23, in a first comparative example, a plurality of second silencing chambers arranged in combination with the first silencing chambers are arranged close to each other. Specifically, the number of silencing chambers 6 is four, the first silencing chamber 65 has a silencing frequency band of 8000 Hz to 8500 Hz, the second silencing chamber 66 has a silencing frequency band of 8700 Hz to 9200 Hz, the third silencing chamber 63 has a silencing frequency band of 5500 Hz to 6500 Hz, and the fourth silencing chamber 62 has a silencing frequency band of 3000 Hz to 4000 Hz. It can be seen from a comparison between FIGS. 10 and 24 that when the second silencing chamber 65 and the second silencing chamber 66 are arranged close to each other, no significant silencing effect is produced at each of the silencing frequency bands of 8000 Hz to 8500 Hz and 8700 Hz to 9200 Hz.

Figure 25:
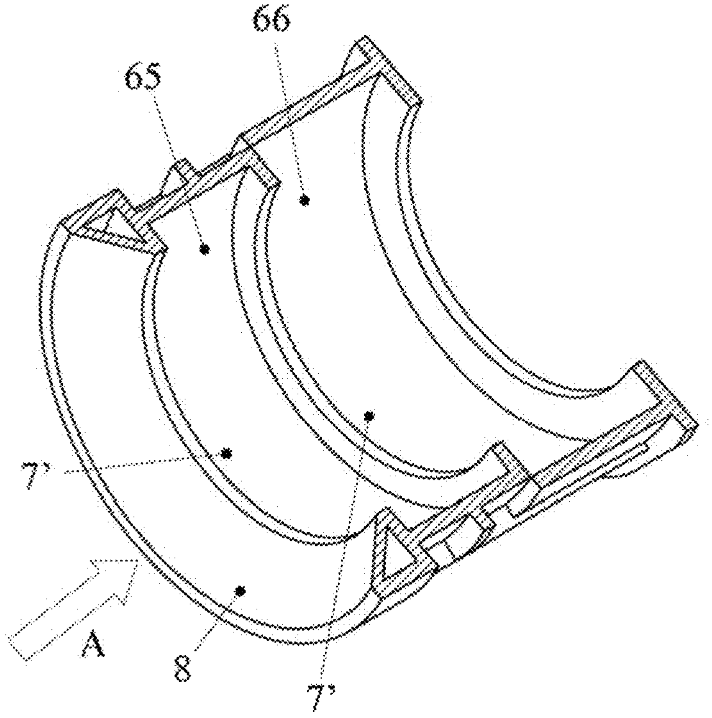
FIG. 25 is a schematic structural diagram of a silencer according to a second comparative example of the present disclosure.
Figure 26:
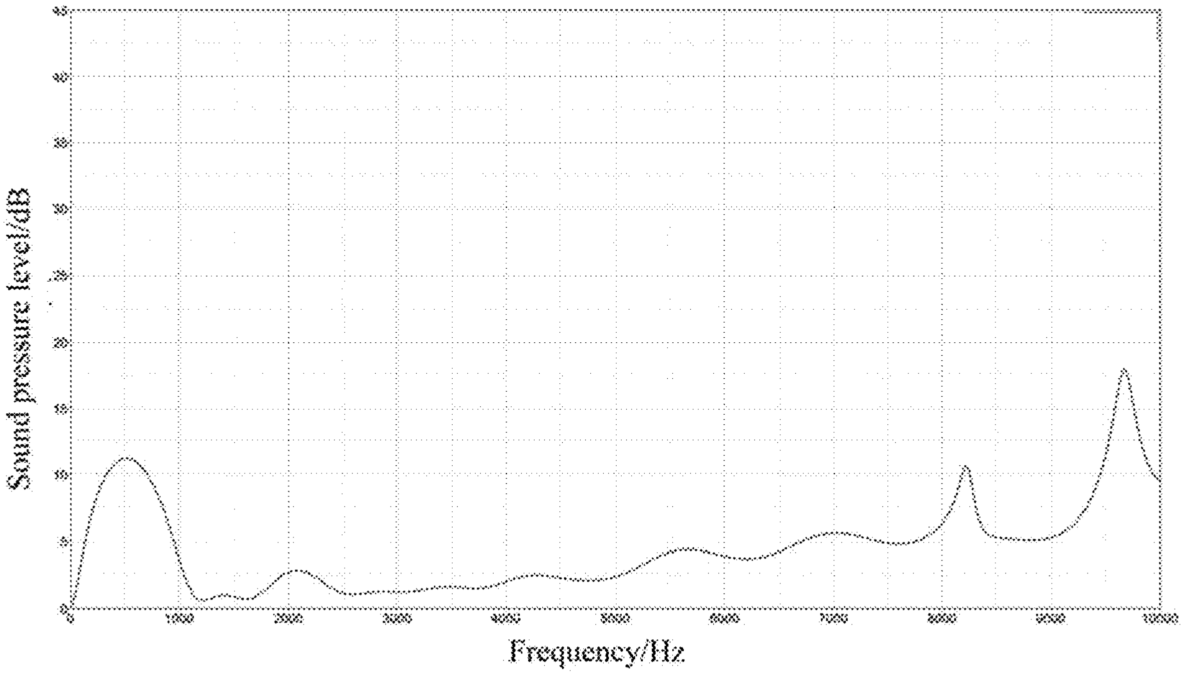
FIG. 26 is a sound pressure level response line graph of sound pressure level in decibels (dB) versus frequency in hertz (Hz) of a silencer according to the second comparative example of the present disclosure.

As shown in FIG. 25, in a second comparative example, only a plurality of second silencing chambers are disposed without being arranged in combination with a first silencing chamber. The number of silencing chambers 6 is two, the first silencing chamber 65 has a silencing frequency band of 8000 Hz to 8500 Hz, and the second silencing chamber 66 has a silencing frequency band of 8700 Hz to 9200 Hz. It can be seen from a comparison between FIG. 26 and FIGS. 20 and 22 that only providing the second silencing chambers will make it so that no significant silencing effect is produced in either of the silencing frequency bands of 8000 Hz to 8500 Hz and 8700 Hz to 9200 Hz.

Figure 27:
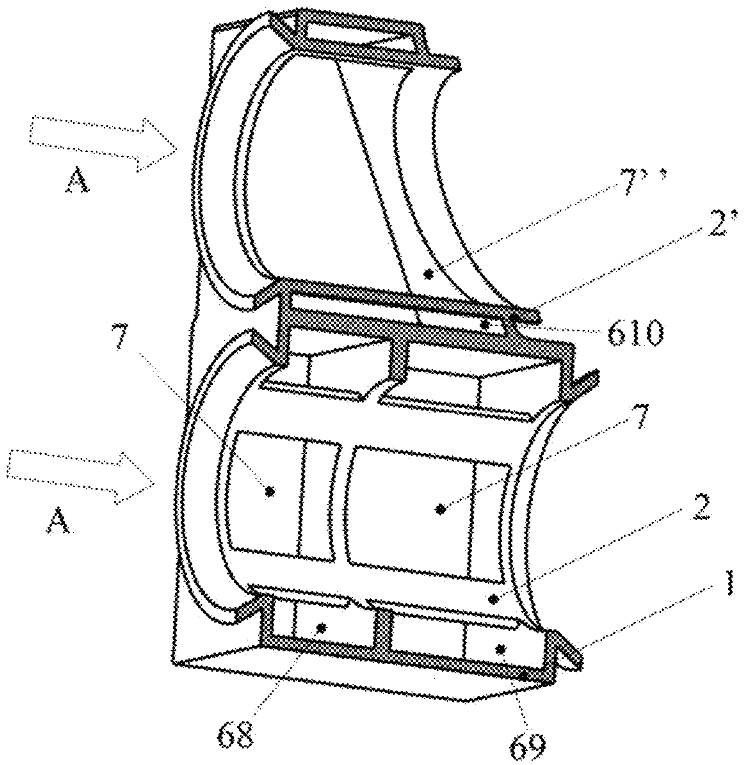
FIG. 27 is a schematic structural diagram of a silencer according to an eighth embodiment of the present disclosure.
Figure 28:
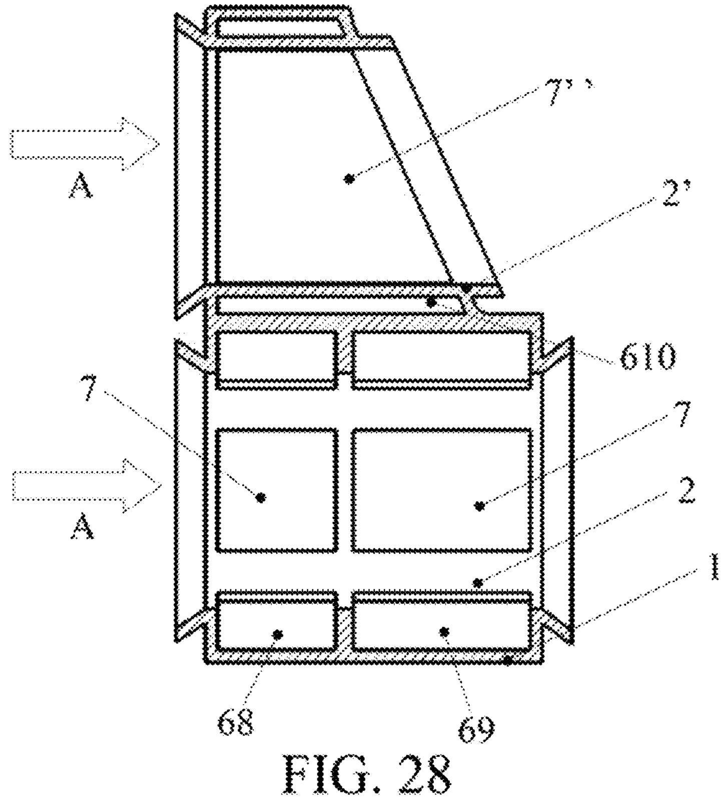
FIG. 28 is a side sectional view of the silencer according to the eighth embodiment of the present disclosure.

As shown in FIGS. 27 and 28, in addition to being disposed to extend perpendicularly to the conveying direction A of the airflow as in the above embodiments, rear end faces of the inner tube 2 and the outer tube 1 may be disposed in other shapes depending on an arrangement space, for example, in an obliquely extending manner. In the eight embodiment shown in FIGS. 27 and 28, two inner tubes 2' are arranged along the vertical direction so as to form a multi-layered silencing structure in cooperation with the outer tube 1. The rear end face of an upper inner tube 2' is inclined to have a substantially inclined circular tube structure so as to make a space behind it to install other devices, and the rear end of the outer tube 1 is also inclined at a position corresponding to the inner tube 2'. The rear end of the opening 7" in the inner tube 2' is also inclined correspondingly.

Figure 29:
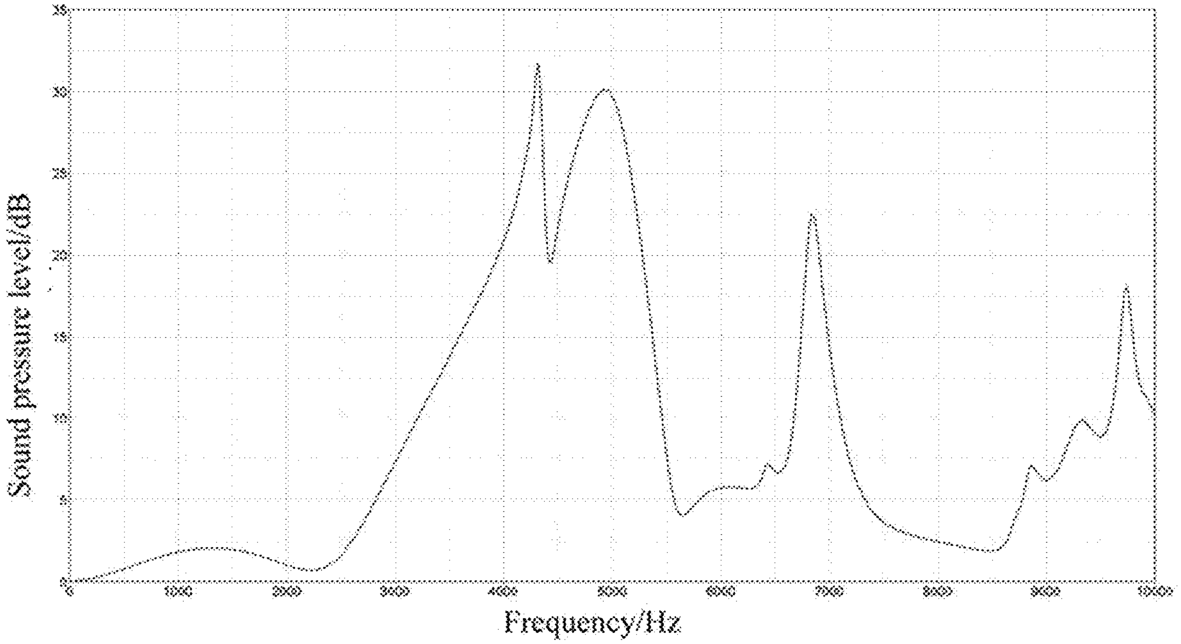
FIG. 29 is a sound pressure level response line graph of sound pressure level in decibels (dB) versus frequency in hertz (Hz) of a lower silencer according to the eighth embodiment of the present disclosure.
Figure 30:
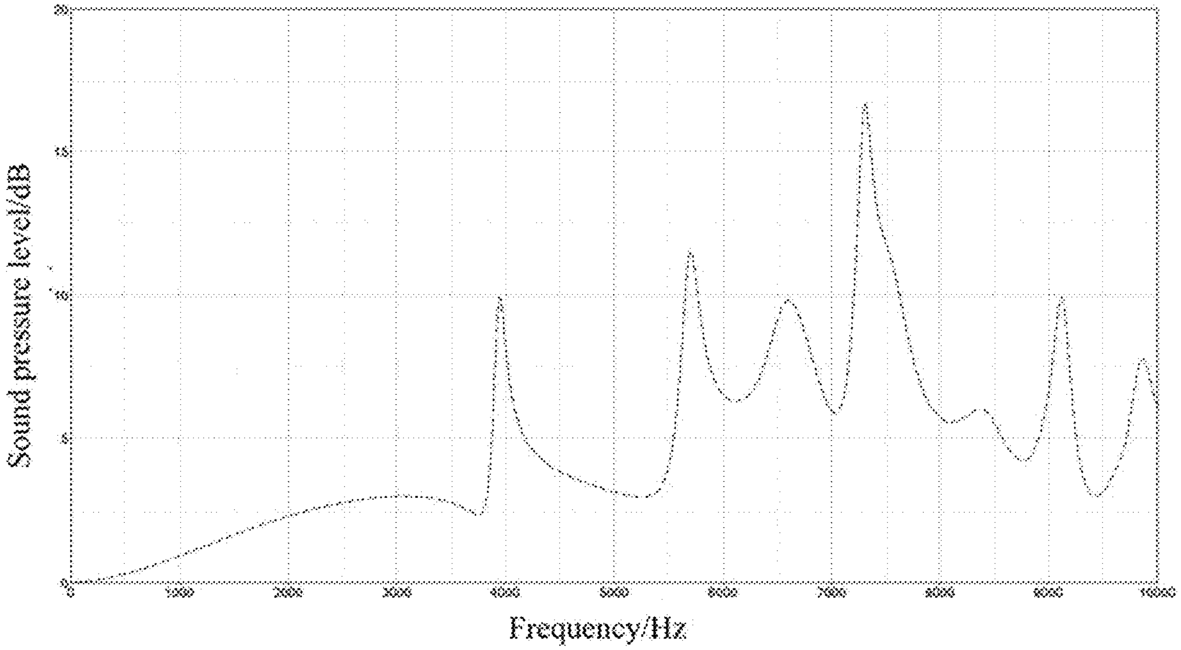
FIG. 30 is a sound pressure level response line graph of sound pressure level in decibels (dB) versus frequency in hertz (Hz) of an upper silencer according to the eighth embodiment of the present disclosure.
Figure 31:
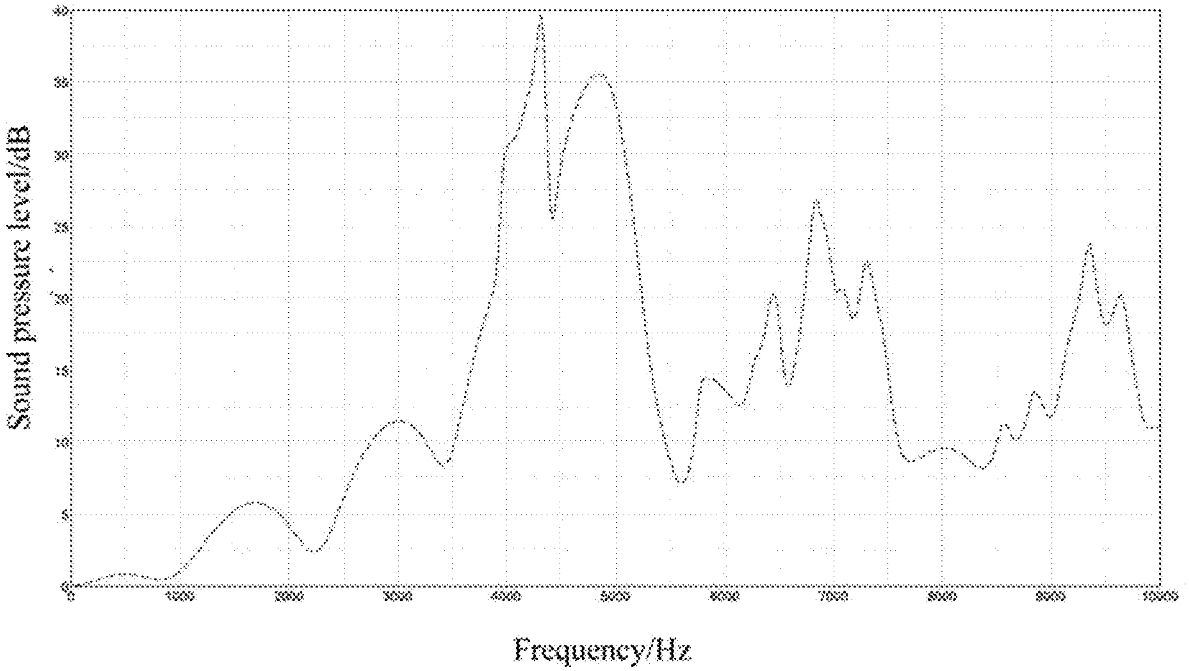
FIG. 31 is a sound pressure level response line graph of sound pressure level in decibels (dB) versus frequency in hertz (Hz) of the entire silencer according to the eighth embodiment of the present disclosure.

A lower inner tube 2' has a straight circular tube structure, that is, the rear end face thereof is disposed to extend in the vertical direction, and the inner tube cooperates with the outer tube 1 to form a first silencing chamber 68 having a silencing frequency band of 4000 Hz to 5000 Hz and a first silencing chamber 69 having a silencing frequency band of 6500 Hz to 7000 Hz, which are arranged in sequence along the conveying direction A of the airflow. An upper inner tube 2 has an inclined circular tube structure, and cooperates with the outer tube 1 to form a first silencing chamber 610 having a silencing frequency band of 5500 Hz to 7500 Hz. With reference to FIGS. 29, 30, and 31, it can be seen that the silencer according to the present embodiment has a good silencing effect for each of the various silencing frequency bands described above.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. It is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping, or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected, or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section could be termed a second element, component, region, layer, or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly. The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A silencer for reducing noise of a heat dissipation fan, the silencer comprising:

an outer tube;

at least one inner tube inside the outer tube such that an annular space is formed between the at least one inner tube and the outer tube, the at least one inner tube including an inner cavity forming a ventilation channel; and a plurality of partition plates in the annular space and partitioning the annular space into a plurality of silencing chambers arranged along a conveying direction of airflow correspondingly to a plurality of silencing frequency bands, the at least one inner tube including a plurality of openings communicating the plurality of silencing chambers with the ventilation channel;

wherein:

an air outlet end of the ventilation channel is communicated with an air inlet of the heat dissipation fan of a fan structure through a rear flow-guiding channel;

the rear flow-guiding channel is tapered outwards along the conveying direction of the airflow;

the air inlet end of the ventilation channel is communicated with a front flow-guiding channel;

the front flow-guiding channel is tapered inwards along the conveying direction of the airflow;

a cellular mesh structure is at an inlet of the front flow-guiding channel; and the rear flow-guiding channel is sealingly connected with the air inlet of the heat dissipation fan through a sealing structure.

2. The silencer of claim 1, wherein:

the higher the silencing frequency band corresponding to the silencing chamber is, the larger an area of the opening correspondingly communicated is and/or the smaller a volume of the silencing chamber is; and the lower the silencing frequency band corresponding to the silencing chamber is, the lower the area of the opening correspondingly communicated is and/or the larger the volume of the silencing chamber is.

3. The silencer of claim 1, wherein:

the plurality of silencing chambers includes a first silencing chamber having a silencing frequency band of 7500 Hz to 8500 Hz, a second silencing chamber having a silencing frequency band of 5500 Hz to 6500 Hz, a third silencing chamber having a silencing frequency band of 3000 Hz to 4000 Hz, and a fourth silencing chamber having a silencing frequency band of 1500 Hz to 2500 Hz; or the plurality of silencing chambers includes a first silencing chamber having a silencing frequency band of 3000 Hz to 4000 Hz, a second silencing chamber having a silencing frequency band of 5500 Hz to 6500 Hz, and a third silencing chamber having a silencing frequency band of 7500 Hz to 8500 Hz.

4. The silencer of claim 1, wherein:

the plurality of first silencing chambers include at least one first-first silencing chamber having a silencing frequency band of 7500 Hz to 8500 Hz, at least one second-first silencing chamber having a silencing frequency band of 5500 Hz to 6500 Hz, at least one third-first silencing chamber having a silencing frequency band of 3000 Hz to 4000 Hz, and at least one fourth-first silencing chamber having a silencing frequency band of 1500 Hz to 2500 Hz; or the plurality of first silencing chambers include at least one fifth-first silencing chamber having a silencing frequency band of 3000 Hz to 4000 Hz, at least one sixth-first silencing chamber having a silencing frequency band of 5500 Hz to 6500 Hz, and at least one seventh-first silencing chamber having a silencing frequency band of 7500 Hz to 8500 Hz.

5. The silencer of claim 1, wherein the sealing structure comprises a mounting plate and a sealing ring.

6. The silencer of claim 1, wherein the plurality of silencing chambers includes:

at least one first-second silencing chamber having a silencing frequency band of 8700 Hz to 9200 Hz, and a single annular opening of the plurality of openings of the at least one inner tube is arranged and extending along a circumferential direction of the at least one first-second silencing chamber;

at least one first-first silencing chamber having a silencing frequency band of 3000 Hz to 4000 Hz, and multiple openings of the plurality of openings of the at least one inner tube are arranged at intervals along a circumferential direction of the at least one first-first silencing chamber;

at least one second-first silencing chamber having a silencing frequency band of 5500 Hz to 6500 Hz, and multiple openings of the plurality of openings of the at least one inner tube are arranged at intervals along a circumferential direction of the at least one second-first silencing chamber; and at least one second-second silencing chamber having a silencing frequency band of 8000 Hz to 8500 Hz, and a single annular opening of the plurality of openings of the at least one inner tube is arranged and extending along a circumferential direction of the at least one second-second silencing chamber; or wherein the plurality of silencing chambers includes:

at least one third-second silencing chamber having a silencing frequency band of 8000 Hz to 8500 Hz, and a single annular opening of the plurality of openings of the at least one inner tube is arranged and extending along a circumferential direction of the at least one third-second silencing chamber;

at least one third-first silencing chamber having a silencing frequency band of 5500 Hz to 6500 Hz, and multiple openings of the plurality of openings of the at least one inner tube are arranged at intervals along a circumferential direction of the at least one third-first silencing chamber;

at least one fourth-second silencing chamber having a silencing frequency band of 8700 Hz to 9200 Hz, and a single annular opening of the plurality of openings of the at least one inner tube is arranged and extending along a circumferential direction of the at least one fourth-second silencing chamber; and at least one fourth-first silencing chamber having a silencing frequency band of 3000 Hz to 4000 Hz, and multiple openings of the plurality of openings of the at least one inner tube are arranged at intervals along a circumferential direction of the at least one fourth-first silencing chamber.

7. The silencer of claim 1, wherein the plurality of silencing chambers have silencing frequencies and are arranged from high silencing frequency to low silencing frequency along the conveying direction of the airflow.

8. A server comprising a heat dissipation fan and the silencer of claim 1, wherein the silencer is operable for sound absorption and noise reduction of fan noise generated by the heat dissipation fan in the server.

9. The silencer of claim 1, wherein the sealing structure comprises a mounting plate and a sealant.

10. The silencer of claim 1, wherein the sealing structure comprises a mounting plate and a sealing member.

11. A silencer for reducing noise of a heat dissipation fan, the silencer comprising:

an outer tube;

at least one inner tube inside the outer tube such that an annular space is formed between the at least one inner tube and the outer tube, the at least one inner tube including an inner cavity forming a ventilation channel; and a plurality of partition plates in the annular space and partitioning the annular space into a plurality of silencing chambers arranged along a conveying direction of airflow correspondingly to a plurality of silencing frequency bands, the at least one inner tube including a plurality of openings communicating the plurality of silencing chambers with the ventilation channel;

wherein the plurality of silencing chambers includes a first silencing chamber having a silencing frequency band of 7500 Hz to 8500 Hz, a second silencing chamber having a silencing frequency band of 5500 Hz to 6500 Hz, a third silencing chamber having a silencing frequency band of 3000 Hz to 4000 Hz, and a fourth silencing chamber having a silencing frequency band of 1500 Hz to 2500 Hz, the first, second, third, and fourth silencing chambers are arranged from high silencing frequency to low silencing frequency along the conveying direction of the airflow; or wherein the plurality of silencing chambers includes a first silencing chamber having a silencing frequency band of 3000 Hz to 4000 Hz, a second silencing chamber having a silencing frequency band of 5500 Hz to 6500 Hz, and a third silencing chamber having a silencing frequency band of 7500 Hz to 8500 Hz.

12. The silencer of claim 11, wherein:

an air outlet end of the ventilation channel is communicated with an air inlet of the heat dissipation fan of a fan structure through a rear flow-guiding channel;

the rear flow-guiding channel is tapered outwards along the conveying direction of the airflow;

the air inlet end of the ventilation channel is communicated with a front flow-guiding channel; and the front flow-guiding channel is tapered inwards along the conveying direction of the airflow.

13. The silencer of claim 12, wherein:

a cellular mesh structure is at an inlet of the front flow-guiding channel; and the rear flow-guiding channel is sealingly connected with the air inlet of the heat dissipation fan through a sealing structure.

14. A silencer for reducing noise of a heat dissipation fan, the silencer comprising:

an outer tube;

at least one inner tube inside the outer tube such that an annular space is formed between the at least one inner tube and the outer tube, the at least one inner tube including an inner cavity forming a ventilation channel; and a plurality of partition plates in the annular space and partitioning the annular space into a plurality of silencing chambers arranged along a conveying direction of airflow correspondingly to a plurality of silencing frequency bands, the at least one inner tube including a plurality of openings communicating the plurality of silencing chambers with the ventilation channel;

wherein the plurality of silencing chambers includes a plurality of first silencing chambers, and the plurality of openings of the at least one inner tube includes multiple openings communicating with each said first silencing chamber that are arranged at intervals along a circumferential direction of the corresponding first silencing chamber; and wherein:

the plurality of first silencing chambers include at least one first-first silencing chamber having a silencing frequency band of 7500 Hz to 8500 Hz, at least one second-first silencing chamber having a silencing frequency band of 5500 Hz to 6500 Hz, at least one third-first silencing chamber having a silencing frequency band of 3000 Hz to 4000 Hz, and at least one fourth-first silencing chamber having a silencing frequency band of 1500 Hz to 2500 Hz; or the plurality of first silencing chambers include at least one fifth-first silencing chamber having a silencing frequency band of 3000 Hz to 4000 Hz, at least one sixth-first silencing chamber having a silencing frequency band of 5500 Hz to 6500 Hz, and at least one seventh-first silencing chamber having a silencing frequency band of 7500 Hz to 8500 Hz.

15. The silencer of claim 14, wherein:

the plurality of silencing chambers comprises at least one second silencing chamber; and the plurality of openings of the at least one inner tube includes a single opening communicating with the at least one second silencing chamber that is an annular opening arranged and extending along a circumferential direction of the corresponding second silencing chamber.

16. The silencer of claim 15, wherein:

the silencer includes only one said second silencing chamber; or the at least one silencing chamber comprises a plurality of second silencing chambers.

17. The silencer of claim 15, wherein the at least one silencing chamber comprises two second silencing chambers such that one second silencing chamber is disposed near an air inlet end of the ventilation channel and another second silencing chamber is disposed near an air outlet end of the ventilation channel.

18. The silencer of claim 15, wherein the silencer includes a sound absorbing foam along an inner wall surface of the outer tube in the at least one second silencing chamber, the sound absorbing foam having a thickness less than a radial width of the annular space.

19. A silencer for reducing noise of a heat dissipation fan, the silencer comprising:

an outer tube;

at least one inner tube inside the outer tube such that an annular space is formed between the at least one inner tube and the outer tube, the at least one inner tube including an inner cavity forming a ventilation channel; and a plurality of partition plates in the annular space and partitioning the annular space into a plurality of silencing chambers arranged along a conveying direction of airflow correspondingly to a plurality of silencing frequency bands, the at least one inner tube including a plurality of openings communicating the plurality of silencing chambers with the ventilation channel; wherein the plurality of silencing chambers includes:

at least one first-second silencing chamber having a silencing frequency band of 8700 Hz to 9200 Hz, and a single annular opening of the plurality of openings of the at least one inner tube is arranged and extending along a circumferential direction of the at least one first-second silencing chamber;

at least one first-first silencing chamber having a silencing frequency band of 3000 Hz to 4000 Hz, and multiple openings of the plurality of openings of the at least one inner tube are arranged at intervals along a circumferential direction of the at least one first-first silencing chamber;

at least one second-first silencing chamber having a silencing frequency band of 5500 Hz to 6500 Hz, and multiple openings of the plurality of openings of the at least one inner tube are arranged at intervals along a circumferential direction of the at least one second-first silencing chamber; and at least one second-second silencing chamber having a silencing frequency band of 8000 Hz to 8500 Hz, and a single annular opening of the plurality of openings of the at least one inner tube is arranged and extending along a circumferential direction of the at least one second-second silencing chamber; or wherein the plurality of silencing chambers includes:

at least one third-second silencing chamber having a silencing frequency band of 8000 Hz to 8500 Hz, and a single annular opening of the plurality of openings of the at least one inner tube is arranged and extending along a circumferential direction of the at least one third-second silencing chamber;

at least one third-first silencing chamber having a silencing frequency band of 5500 Hz to 6500 Hz, and multiple openings of the plurality of openings of the at least one inner tube are arranged at intervals along a circumferential direction of the at least one third-first silencing chamber;

at least one fourth-second silencing chamber having a silencing frequency band of 8700 Hz to 9200 Hz, and a single annular opening of the plurality of openings of the at least one inner tube is arranged and extending along a circumferential direction of the at least one fourth-second silencing chamber; and at least one fourth-first silencing chamber having a silencing frequency band of 3000 Hz to 4000 Hz, and multiple openings of the plurality of openings of the at least one inner tube are arranged at intervals along a circumferential direction of the at least one fourth-first silencing chamber.

* * * * *